(12) United States Patent
Hoshi et al.

(10) Patent No.: US 8,632,892 B2
(45) Date of Patent: Jan. 21, 2014

(54) ORGANIC ELECTRONIC MATERIAL, ORGANIC ELECTRONIC DEVICE, AND ORGANIC ELECTROLUMINESCENT DEVICE

(75) Inventors: Yousuke Hoshi, Tsukuba (JP); Shigeaki Funyuu, Tsuchiura (JP); Yoshii Morishita, Tsukuba (JP)

(73) Assignee: Hitachi Chemical Co., Ltd., Tokyo (JP)

(*) Notice: Subject to any disclaimer, the term of this patent is extended or adjusted under 35 U.S.C. 154(b) by 818 days.

(21) Appl. No.: 12/374,134

(22) PCT Filed: Jul. 17, 2007

(86) PCT No.: PCT/JP2007/064090
§ 371 (c)(1),
(2), (4) Date: Jan. 16, 2009

(87) PCT Pub. No.: WO2008/010487
PCT Pub. Date: Jan. 24, 2008

(65) Prior Publication Data
US 2009/0321723 A1    Dec. 31, 2009

(30) Foreign Application Priority Data

Jul. 19, 2006 (JP) .............................. P2006-196780
Jan. 26, 2007 (JP) .............................. P2007-016898

(51) Int. Cl.
*H01L 51/54*    (2006.01)

(52) U.S. Cl.
USPC ........... 428/690; 428/917; 313/504; 313/505; 313/506; 257/40; 257/E51.05; 257/E51.026; 257/E51.032; 564/26; 564/426; 564/434

(58) Field of Classification Search
USPC .................. 428/690, 917; 313/504, 505, 506; 257/40, E51.05, E51.026, E51.032; 564/26, 426, 434
See application file for complete search history.

(56) References Cited

U.S. PATENT DOCUMENTS

| 4,539,507 | A | 9/1985 | VanSlyke et al. |
| 5,151,629 | A | 9/1992 | VanSlyke |
| 5,929,194 | A | 7/1999 | Woo et al. |
| 6,107,452 | A | 8/2000 | Miller et al. |

(Continued)

FOREIGN PATENT DOCUMENTS

| EP | 0 443 861 B1 | 7/1995 |
| JP | 2004-119393 | 4/2004 |

(Continued)

OTHER PUBLICATIONS

Korean Official Action issued Nov. 16, 2010, for KR Application No. 10-2009-7000885.

(Continued)

*Primary Examiner* — Gregory Clark
(74) *Attorney, Agent, or Firm* — Antonelli, Terry, Stout & Kraus, LLP.

(57) ABSTRACT

An object of the present invention is to provide an organic electronic material that can be easily formed into a multilayer structure. A further object of the present invention is to provide an organic electronic device and an organic EL device that exhibit a better emission efficiency and a better emission lifetime than heretofore achieved. In order to achieve these objects, an organic electronic material is provided, the material includes a polymer or oligomer that has at least one polymerizable substituent and a hole-transporting repeat unit.

12 Claims, 4 Drawing Sheets

(56) References Cited

U.S. PATENT DOCUMENTS

| | | | |
|---|---|---|---|
| 6,306,555 B1 * | 10/2001 | Schulz et al. | 430/270.1 |
| 2005/0186106 A1 * | 8/2005 | Li et al. | 420/500 |
| 2009/0174311 A1 | 7/2009 | Patel et al. | |

FOREIGN PATENT DOCUMENTS

| | | |
|---|---|---|
| JP | 2005-243300 | 9/2005 |
| JP | 2005-251734 | 9/2005 |
| JP | 2007-520858 | 7/2007 |
| WO | WO 90/13148 | 11/1990 |
| WO | WO 2005/024971 | 3/2005 |
| WO | WO 2005/059951 A2 | 6/2005 |
| WO | WO 2005059951 | 6/2005 |
| WO | WO 2005/083812 | 9/2005 |
| WO | WO 2005/089024 | 9/2005 |

OTHER PUBLICATIONS

Chinese Official Action dated Dec. 7, 2010, in connection with CN Application No. 2007800269694.

IPER dated Jan. 29, 2009, for PCT Appln. No. PCT/JP2007/064090.

Y. Goto, T. Hayashida, M. Noto, "All-Wet-Organic Electroluminescent Device Using Electron Transporting and Alcohol-Soluble Organic Semiconductor," IDW '04 Proceedings of the 11$^{th}$ International Display Workshop, pp. 1343-1346 (2004).

K. Hirose, D. Kumaki, N. Koike, A. Kuriyama, S. Ikehata and S. Tokito, 26p-ZK-4 (2006) "Improvement of Efficiency in a Polymer EL (Electroluminescent) Device by Using a Photocurable Material". (High Efficiency of PLED Using Cross-Linkable Hole Transport Material).

H. Lan, P. Lee, N. R. Armstrong, A. Graham, G.A. Evmenenko, P. Dutto, T.J. Marks, "High-Performance Hole-Transport Layers for Polymer Light-Emitting Diodes, Implementation of Organosiloxane Cross-Linking Chemistry in Polymeric Electroluminescent Devices," J. Am. Chem. Soc., 127, pp. 3172-4183 (2005).

T. Yamamoto, "A Novel Type of Polycondensation Utilizing Transition Metal-Catalyzed C—C Coupling". (Jul. 1978), Bull. Chem. Soc. Jap., vol. 51, No. 7, p. 2091 (1978).

M. Sembayashi, K. Tamao, J. Yoshida, M. Kumada, "Nickel-Phosphine Complex-Catalyzed Homo Coupling of Aryl Halides in the Presence of Zinc Powder." Tetrahedron Letters No. 47, pp. 4089-4092, 1977. Pergamon Press. Printed in Great Britain.

N. Miyaura, T. Yanagi, A. Suzuki, "The Palladium-Catalyzed Cross-Coupling Reaction of Phenylboronic Acid With Haloarenes in the Presence of Bases", Synthetic Communications, vol. 11, No. 7, p. 513 (1981).

Chinese Official Action issued Feb. 5, 2010, for Application No. 200780026969.

Chinese Official Action issued Aug. 9, 2010, for CN Application No. 200780026969.4.

Taiwanese Official Action dated Jul. 5, 2011, in connection with TW Application No. 10020582640.

Chinese Official Action dated Aug. 26, 2011, in connection with CN Application No. 200780026969.4.

Korean Official Action dated May 18, 2012, in connection with KR Application No. 10-2007-7003569.

Korean Official Action dated May 18, 2012, in connection with KR Application No. 10-2011-7003570.

Japanese Official Action dated May 22, 2012, in connection with JP Application No. 2008-525860.

Japanese Official Action dated Mar. 5, 2013, for JP Application No. 2008-525860.

D. C. Muller, et al., "Efficient Blue Organic Light-Emitting Diodes with Graded Hole-Transport Layers**", *Chemphyschem 2000*, vol. 1, No. 4, pp. 207-211.

Chinese Official Action issued on Oct. 23, 2013, in CN Application No. 200780026969.4.

* cited by examiner

SEC Summary information

UV-VIS 2
Processing Start Time (min) = 16.158
Processing Stop Time (min) = 21.194
Number of Slices = 302
Weight Average Molecular Weight = 5128
Number Average Molecular Weight = 3456
Z Average Molecular Weight = 7395
Z+1 Average Molecular Weight = 9970
Polydispersity index = 1.484
Peak Molecular Weight = 3469
Z Average / Weight Average = 1.442
Z+1 Average / Weight Average = 1.944

ORGANIC ELECTRONIC MATERIAL, ORGANIC ELECTRONIC DEVICE, AND ORGANIC ELECTROLUMINESCENT DEVICE

TECHNICAL FIELD

The present invention relates to an organic electronic material and to an organic electronic device and organic electroluminescent device (also referred to below as an organic EL device) that use this organic electronic material.

BACKGROUND

Organic electronic devices are devices that carry out an electrical operation using an organic material. They are expected to offer advantages such as low energy consumption, low cost, and flexibility and they are receiving attention as a technology for replacing conventional silicon-based inorganic semiconductors.

Organic EL devices, as a subset of organic electronic devices, are being considered, for example, for application as a large-area solid-state light source to replace incandescent lamps and gas-filled lamps. In addition, in the flat panel display (FPD) sector they are also being considered as a front-running self-emissive display technology to replace liquid crystal displays (LCD) and their development as commercial products is underway.

Organic EL devices can be generally classified into two categories based on the materials used and the film production method: small molecule organic EL devices and polymer organic EL devices. The organic material is composed of a polymer material in the case of polymer organic EL devices, and polymer organic EL devices are essential devices for the large-screen organic EL displays of the future since they support easier film formation, e.g., by printing or inkjet, than is the case for the small molecule organic EL devices, which require film formation in a vacuum system.

While to date both small molecule organic EL devices and polymer organic EL devices have been the subject of strong research efforts, their low emission efficiency and short device lifetime are still major problems in both instances. The formation of small molecule organic EL devices in multiple layers has been carried out as one approach for solving these problems.

An example of a multilayer organic EL device is shown in FIG. 1. In FIG. 1, the layer that carries out light emission is designated as the light-emitting layer 1, and when other layers are present the layer in contact with the anode 2 is designated as the hole injection layer 3 and the layer in contact with the cathode 4 is designated as the electron injection layer 5. When another layer is present between the light-emitting layer 1 and the hole injection layer 3, this layer is designated as a hole transport layer 6; when another layer is present between the light-emitting layer 1 and the electron injection layer 5, this layer is designated as an electron transport layer 7. Reference number 8 in FIG. 1 refers to a substrate.

Since in the case of small molecule organic EL devices film formation is carried out by vapor deposition procedures, multilayering can be easily accomplished by carrying out vapor deposition while successively changing the compounds used. In the case of polymer organic EL devices, on the other hand, film formation is carried out using a wet process, such as printing or inkjet, and in order to elaborate multiple layers a procedure is therefore required in which the previously formed layers are not altered during the production of a new layer.

In practice, almost all polymer organic EL devices are devices that have the following two-layer structure: a hole injection layer comprising polythiophene:polystyrenesulfonic acid (PEDOT:PSS) and formed using a water-based dispersion, and a light-emitting layer formed using an aromatic organic solvent such as toluene. Fabrication of the two-layer structure in this instance is made possible by the fact that the PEDOT:PSS layer is not soluble in toluene.

The difficulty that has been encountered in elaborating even more layers in the case of polymer organic EL devices is due to the dissolution of the lower layers when layering is carried out using similar solvents. In order to respond to this problem, a device has been proposed that has a three-layer structure that uses compounds with substantially different solubilities (refer, for example, to Nonpatent Reference 1). In addition, a device has also been reported that has a three-layer structure that contains a hole transport layer that utilizes a photocuring reaction (refer, for example, to Nonpatent Reference 2). A device has also been reported that has a three-layer structure that has a hole transport layer that utilizes a crosslinking reaction by siloxane compounds (refer, for example, to Nonpatent Reference 3). While these are important processes, they have not been free of problems; for example, solubility considerations place limitations on the materials that can be used, while the siloxane compounds are unstable to atmospheric moisture. In addition, in all instances the device characteristics have not been satisfactory.

Patent Reference 1: U.S. Pat. No. 4,539,507
Patent Reference 2: U.S. Pat. No. 5,151,629
Patent Reference 3: International Publication WO 90/13148 Pamphlet
Patent Reference 4: European Patent Publication EP 0 443 861 A
Nonpatent Reference 1: Y. Goto, T. Hayashida, M. Noto, IDW '04 Proceedings of the 11th International Display Workshop, 1343-1346 (2004)
Nonpatent Reference 2: Kengo HIROSE, Daisuke KUMAKI, Nobuaki KOIKE, Akira KURIYAMA, Seiichiro IKEHATA, and Shizuo TOKITO, 53rd Meeting of the Japan Society of Applied Physics and Related Societies, 26p-ZK-4 (2006)
Nonpatent Reference 3: H. Yan, P. Lee, N. R. Armstrong, A. Graham, G. A. Evmenenko, P. Dutta, T. J. Marks, *J. Am. Chem. Soc.*, 127, 3172-4183 (2005)
Nonpatent Reference 4: T. Yamamoto, Bull. *Chem. Soc. Jap.*, Volume 51, Number 7, p. 2091 (1978)
Nonpatent Reference 5: M. Zembayashi, *Tet. Lett.*, Volume 47, p. 4089 (1977)
Nonpatent Reference 6: *Synthetic Communications*, Volume 11, Number 7, p. 513 (1981)

DISCLOSURE OF THE INVENTION

In order to raise the efficiency and extend the life of organic EL devices, it is desirable to form the organic layer as a multilayer and to separate the functions of the individual layers. However, in order to use a wet process, the wet process supports facile film production even over large areas, to form the organic layer as a multilayer in the fabrication of polymer organic EL devices, it has been necessary that the lower layers not be dissolved during production of the overlying layers.

Considering the problems cited above, an object of the present invention is to provide an organic electronic material that can be easily formed as multiple layers. A further object of the present invention is to provide an organic electronic device and an organic EL element that exhibit a better emission efficiency and a better emission lifetime than heretofore exhibited.

As a result of concerted investigations, the present inventors discovered that a mixture comprising a polymer or oligomer that has at least one polymerizable substituent and a hole-transporting repeat unit can easily form a thin film and can do so in a consistent manner and that the solubility can be changed by polymerization. It was also discovered that such a mixture is useful as an organic electronic material. The present research was completed based on these discoveries.

That is, the characteristic features of the present invention are given in the following (1) to (18).

(1) An organic electronic material, comprising a polymer or oligomer having at least one polymerizable substituent and a hole-transporting repeat unit.

(2) The organic electronic material according to the preceding (1), wherein the hole-transporting repeat unit of the polymer or oligomer is any of the following general formulas (1a), (2a), (3a), (4a), (5a), and (6a)

[Formula 1]

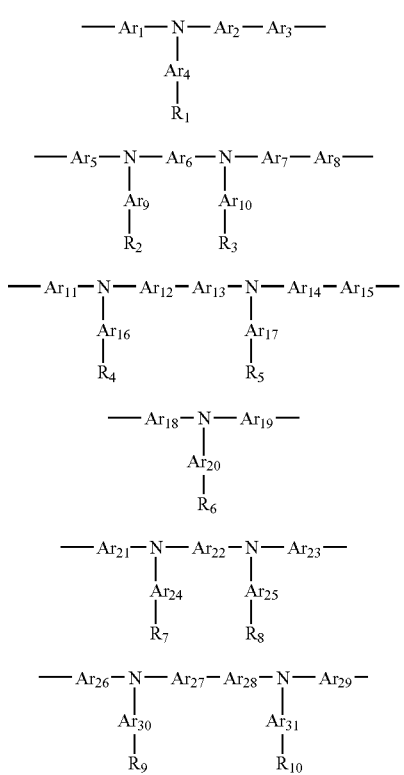

(in the formulas, $Ar_1$ to $Ar_{31}$ each independently represent substituted or unsubstituted arylene or heteroarylene; $R_1$ to $R_{10}$ each independently represent $-R^1$, $-OR^2$, $-SR^3$, $-OCOR^4$, $-COOR^5$, $-SiR^6R^7R^8$, or a general formula as follows.

[Formula 2]

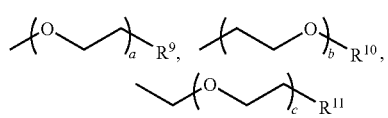

(where $R^1$ to $R^{11}$ represent the hydrogen atom, $C_{1-22}$ straight-chain, cyclic or branched alkyl, or $C_{2-30}$ aryl or heteroaryl, and a, b, and c each represent an integer with a value of at least 1)).

(3) The organic electronic material according to the preceding (1) or (2), wherein the polymerizable substituent in the polymer or oligomer is the oxetane group, epoxy group, vinyl group, acrylate group, or methacrylate group.

(4) The organic electronic material according to any of the preceding (1) to (3), wherein the polymerizable substituent in the polymer or oligomer is introduced in terminal position on the polymer or oligomer.

(5) The organic electronic material according to any of the preceding (1) to (4), wherein the number-average molecular weight of the polymer or oligomer is at least 1,000 and no more than 100,000.

(6) The organic electronic material according to any of the preceding (1) to (5), wherein the polydispersity of the polymer or oligomer is larger than 1.0.

(7) The organic electronic material according to any of the preceding (1) to (6), wherein the polymer or oligomer has the structure represented by general formula (7a) below

[Formula 3]

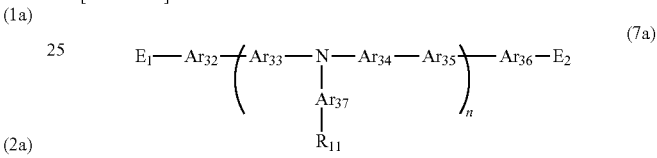

(in the formula, $Ar_{32}$ to $Ar_{37}$ each independently represent substituted or unsubstituted arylene or heteroarylene; $E_1$ and $E_2$ each represent a group that has a polymerizable substituent; and $R_{11}$ represents $-R^1$, $-OR^2$, $-SR^3$, $-OCOR^4$, $-COOR^5$, $-SiR^6R^7R^8$, or a general formula as follows

[Formula 4]

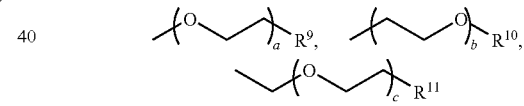

(where $R^1$ to $R^{11}$ represent the hydrogen atom, $C_{1-22}$ straight-chain, cyclic or branched alkyl, or $C_{2-30}$ aryl or heteroaryl, and a, b, and c each represent an integer with a value of at least 1)).

(8) The organic electronic material according to any of the preceding (1) to (6), wherein the polymer or oligomer has the structure represented by general formula (8a) below

[Formula 5]

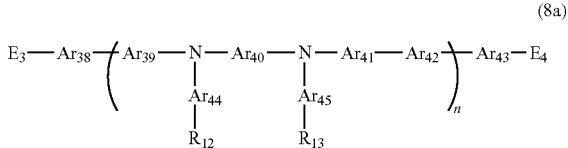

(in the formula, $Ar_{38}$ to $Ar_{45}$ each independently represent substituted or unsubstituted arylene or heteroarylene; $E_3$ and $E_4$ each represent a group that has a polymerizable substituent; and $R_{12}$ and $R_{13}$ each independently represent $-R^1$, $-OR^2$, $-SR^3$, $-OCOR^4$, $-COOR^5$, $-SiR^6R^7R^8$, or a general formula as follows

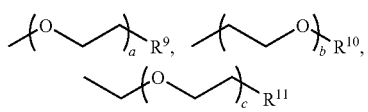
[Formula 6]

(where $R^1$ to $R^{11}$ represent the hydrogen atom, $C_{1-22}$ straight-chain, cyclic or branched alkyl, or $C_{2-30}$ aryl or heteroaryl, and a, b, and c each represent an integer with a value of at least 1)).

(9) The organic electronic material according to any of the preceding (1) to (6), wherein the polymer or oligomer has the structure represented by general formula (9a) below

[Formula 7]

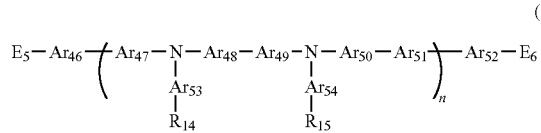
(9a)

(in the formula, $Ar_{46}$ to $Ar_{54}$ each independently represent substituted or unsubstituted arylene or heteroarylene; $E_5$ and $E_6$ each represent a group that has a polymerizable substituent; and $R_{14}$ and $R_{15}$ each independently represent $-R^1$, $-OR^2$, $-SR^3$, $-OCOR^4$, $-COOR^5$, $-SiR^6R^7R^8$, or a general formula as follows

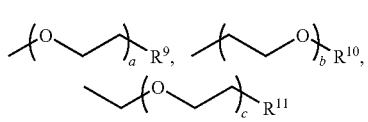
[Formula 8]

(where $R^1$ to $R^{11}$ represent the hydrogen atom, $C_{1-22}$ straight-chain, cyclic or branched alkyl, or $C_{2-30}$ aryl or heteroaryl, and a, b, and c each represent an integer with a value of at least 1)).

(10) The organic electronic material according to any of the preceding (1) to (6), wherein the polymer or oligomer has the structure represented by general formula (10a) below

[Formula 9]

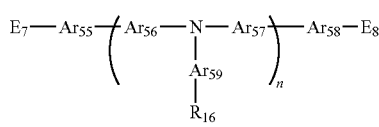
(10a)

(in the formula, $Ar_{55}$ to $Ar_{59}$ each independently represent substituted or unsubstituted arylene or heteroarylene; $E_7$ and $E_8$ each represent a group that has a polymerizable substituent; and $R_{16}$ represents $-R^1$, $-OR^2$, $-SR^3$, $-OCOR^4$, $-COOR^5$, $-SiR^6R^7R^8$, or a general formula as follows

[Formula 10]

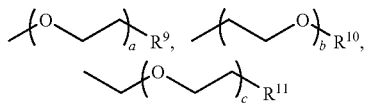

(where $R^1$ to $R^{11}$ represent the hydrogen atom, $C_{1-22}$ straight-chain, cyclic or branched alkyl, or $C_{2-30}$ aryl or heteroaryl, and a, b, and c each represent an integer with a value of at least 1)).

(11) The organic electronic material according to any of the preceding (1) to (6), wherein the polymer or oligomer has the structure represented by general formula (11a) below

[Formula 11]

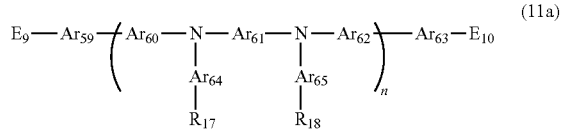
(11a)

(in the formula, $Ar_{59}$ to $Ar_{65}$ each independently represent substituted or unsubstituted arylene or heteroarylene; $E_9$ and $E_{10}$ each represent a group that has a polymerizable substituent; and $R_{17}$ and $R_{18}$ each independently represent $-R^1$, $-OR^2$, $-SR^3$, $-OCOR^4$, $-COOR^5$, $-SiR^6R^7R^8$, or a general formula as follows

[Formula 12]

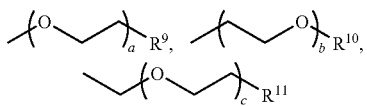

(where $R^1$ to $R^{11}$ represent the hydrogen atom, $C_{1-22}$ straight-chain, cyclic or branched alkyl, or $C_{2-30}$ aryl or heteroaryl, and a, b, and c each represent an integer with a value of at least 1)).

(12) The organic electronic material according to any of the preceding (1) to (6), wherein the polymer or oligomer has the structure represented by general formula (12a) below

[Formula 13]

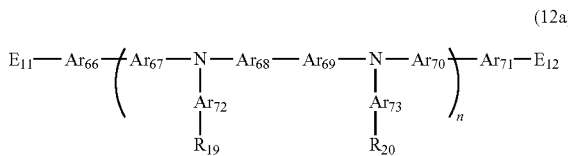
(12a)

(in the formula, $Ar_{66}$ to $Ar_{73}$ each independently represent substituted or unsubstituted arylene or heteroarylene; $E_{11}$ and $E_{12}$ each represent a group that has a polymerizable substituent; and $R_{19}$ and $R_{20}$ each independently represent $-R^1$, $-OR^2$, $-SR^3$, $-OCOR^4$, $-COOR^5$, $-SiR^6R^7R^8$, or a general formula as follows

[Formula 14]

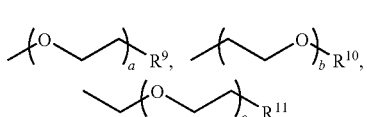

(where $R^1$ to $R^{11}$ represent the hydrogen atom, $C_{1-22}$ straight-chain, cyclic or branched alkyl, or $C_{2-30}$ aryl or heteroaryl, and a, b, and c each represent an integer with a value of at least 1)).

(13) The organic electronic material according to any of the preceding (7) to (12), wherein the numerical average of n in general formula (7a), (8a), (9a), (10a), (11a), or (12a) is 2 to 20.

(14) The organic electronic material according to any of the preceding (1) to (13), further comprising a polymerization initiator.

(15) An organic electronic device fabricated by using the organic electronic material according to any of the preceding (1) to (14).

(16) An organic electroluminescent device fabricated by using the organic electronic material according to any of the preceding (1) to (14).

(17) An organic electroluminescent device in which at least an anode, a hole injection layer, a light-emitting layer, and a cathode are stacked, wherein the hole injection layer is a layer formed by using the organic electronic material according to any of the preceding (1) to (14).

(18) An organic electroluminescent device in which at least an anode, a hole transport layer, a light-emitting layer, and a cathode are stacked, wherein the hole transport layer is a layer formed by the organic electronic material according to any of the preceding (1) to (14).

The organic electronic material of the present invention can easily form a thin film in a consistent manner and, due to the change in solubility brought about by a polymerization reaction, readily enables the formation of the organic thin film layer in a multilayer configuration. It is therefore an extremely useful material for improving the emission efficiency and emission life of organic electronic devices and particular polymer organic EL devices and also for raising the productivity associated therewith.

This application carries priority based on Japanese Patent Application 2006-196780 (filed 19 Jul. 2006) and Japanese Patent Application 2007-016898 (filed 26 Jan. 2007), previously filed by the present patent applicant, and incorporates their Specifications herein as references.

BEST MODE FOR CARRYING OUT THE INVENTION

Figure 1:
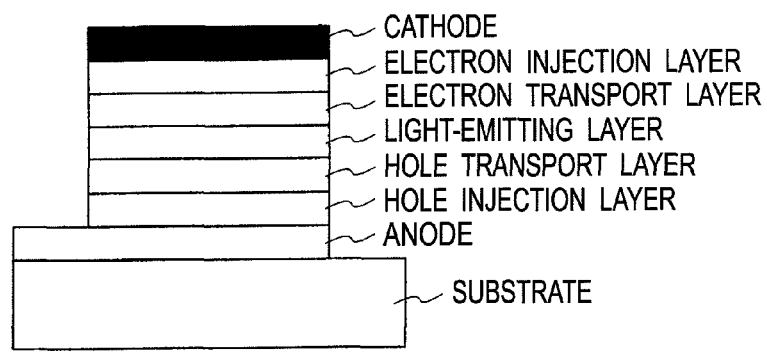
FIG. 1 is a schematic diagram that shows an example of a multilayered organic EL device.

The organic electronic material of the present invention characteristically comprises oligomer or polymer that has at least one polymerizable substituent and a hole-transporting repeat unit.

Here, the "hole-transporting repeat unit" specified above is an atomic group that has the capacity to transport holes and is considered in detail below.

There are no particular limitations on this hole-transporting repeat unit other than that it is a monomer unit that has the capacity to transport holes; however, aromatic ring-containing amine structures are particularly preferred and can be exemplified by the following general formulas (1a), (2a), (3a), (4a), (5a), and (6a).

[Formula 15]

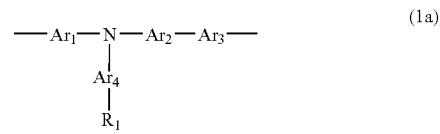

(1a)

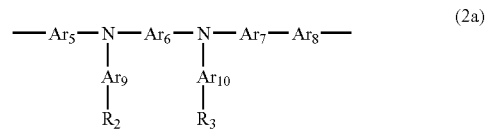

(2a)

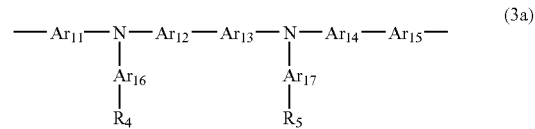

(3a)

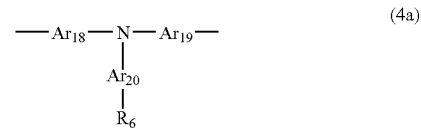

(4a)

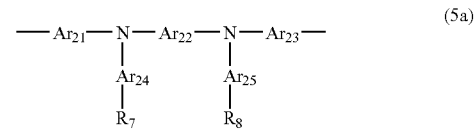

(5a)

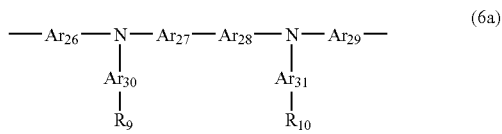

(6a)

$Ar_1$ to $Ar_{31}$ in general formulas (1a), (2a), (3a), (4a), (5a), and (6a) each independently represent substituted or unsubstituted arylene or heteroarylene. Here, arylene refers to an atomic group obtained by removing two hydrogen atoms from an aromatic hydrocarbon, while heteroarylene refers to an atomic group obtained by removing two hydrogen atoms from a heteroatom-containing aromatic compound. The arylene and heteroarylene may be substituted or unsubstituted. The arylene can be exemplified by phenylene, biphenyldiyl, terphenyldiyl, naphthylenediyl, anthracenediyl, tetracenediyl, fluorenediyl, phenanthrenediyl, and so forth, while the heteroarylene can be exemplified by pyridinediyl, pyrazinediyl, quinolinediyl, isoquinolinediyl, acridinediyl, phenanthrolinediyl, furandiyl, pyrrolediyl, thiophenediyl, oxazolediyl, oxadiazolediyl, thiadiazolediyl, triazolediyl, benzoxazolediyl, benzoxadiazolediyl, benzothiadiazolediyl, benzotriazolediyl, benzothiophenediyl, and so forth. The following structural formulas (1) to (30) are examples of possibly substituted arylenes and possibly substituted heteroarylenes.

[Formula 16]
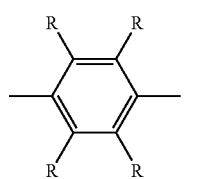 (1)
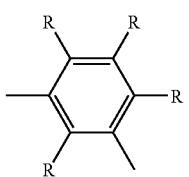 (2)
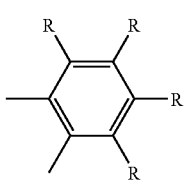 (3)
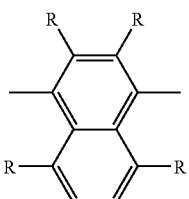 (4)
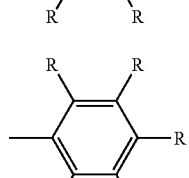 (5)
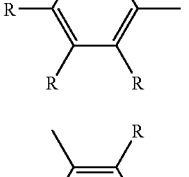 (6)
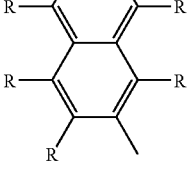 (7)
-continued
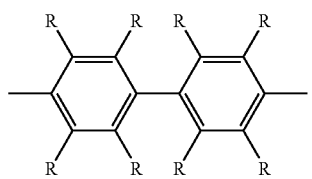 (8)
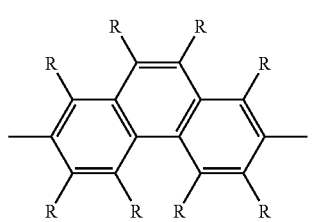 (9)
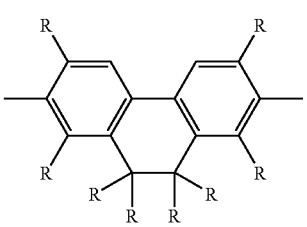 (10)
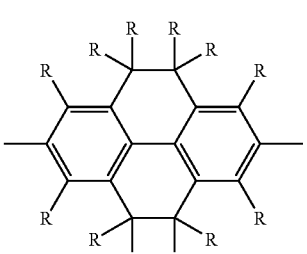 (11)
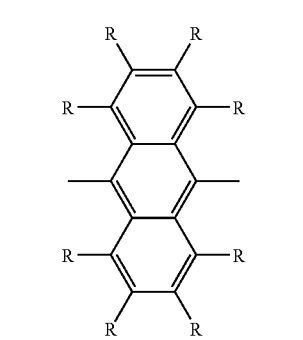 (12)
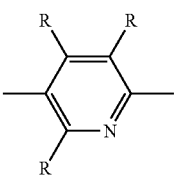 (13)
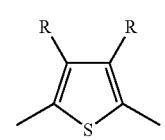 (14)
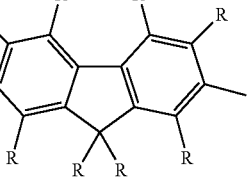

-continued
(15)
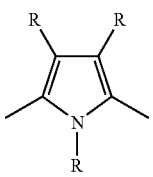
(16)
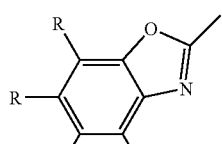
(17)
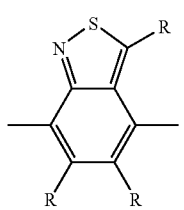
(18)
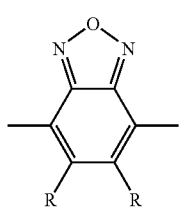
(19)
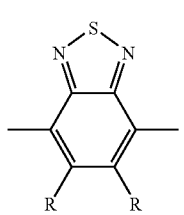
(20)
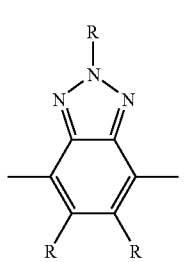
(21)
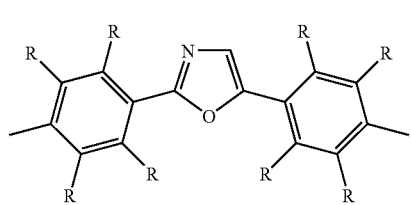
-continued
(22)
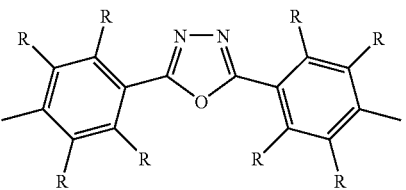
(23)
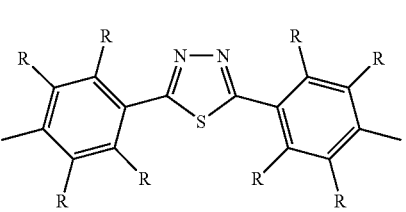
(24)
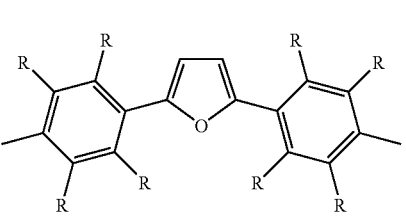
(25)
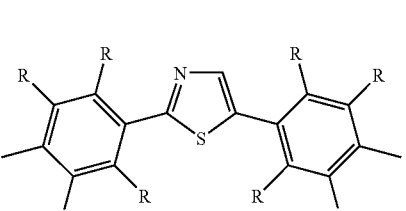
(26)
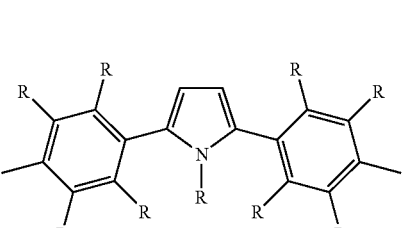
(27)
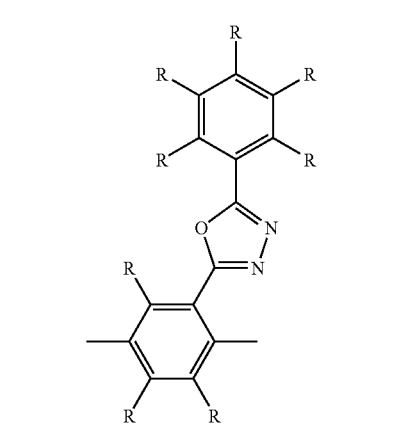

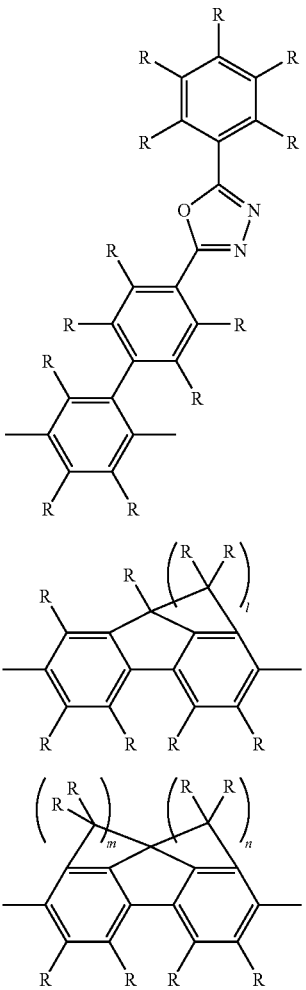

(28)

(29)

(30)

The $R_1$ to $R_{10}$ substituents in general formulas (1a), (2a), (3a), (4a), (5a), and (6a) and the substituent R in structural formulas (1) to (30) are not particularly restricted, are each independently selected, and can be exemplified by —$R^1$, —$OR^2$, —$SR^3$, —$OCOR^4$, —$COOR^5$, —$SiR^6R^7R^8$, or a polyether with the following general formula

[Formula 17]

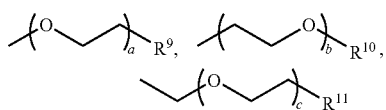

(in the formulas, $R^1$ to $R^{11}$ represent the hydrogen atom, $C_{1-22}$ straight-chain, cyclic or branched alkyl, or $C_{2-30}$ aryl or heteroaryl, and a, b, and c each represent an integer with a value of at least 1 and preferably are integers from 1 to 4). Among the preceding substituents, the following are preferred for the aforementioned $R_1$ to $R_{10}$ and R, each considered independently, from the standpoints of the polymerizability and heat resistance: the hydrogen atom (i.e., unsubstituted); direct substitution by the alkyl, aryl, or heteroaryl represented by —$R^1$; and the hydroxyl, alkoxy, aryloxy, and heteroaryloxy represented by —$OR^2$.

Based on solubility and chemical stability considerations, the arylene or heteroarylene not directly bonded to nitrogen in the aforementioned general formulas (1a), (2a), (3a), (4a), (5a), and (6a) ($Ar_3$, $Ar_8$, and $Ar_{15}$ in these formulas) is preferably phenylene, fluorenediyl, phenanthrenediyl, or the above-cited structural formula (29) or (30), which have condensed ring structures. l, m, and n in structural formulas (29) and (30) are integers from 1 to 5 and preferably are integers from 2 to 4. In addition, when the organic electronic material of the present invention is used for the hole transport layer or hole injection layer of an organic EL device, the hole transport layer or hole injection layer desirably has a high LUMO level in order to efficiently trap electrons in the light-emitting layer and thereby raise the emission efficiency. Viewed from this perspective, the use of structural formulas (29) and (30) with their polycyclic structures is more preferred.

In order to adjust the solubility, heat resistance, and electrical properties, the polymer or oligomer used in the present invention may be a copolymer that contains the aforementioned arylene group and/or heteroarylene group as a copolymerized repeat unit, in addition to the hole-transporting repeat unit. In this instance the copolymer may be a random, block, or graft copolymer or may be a polymer that has a structure intermediate therebetween or thereamong, for example, a random copolymer with some block characteristics. In addition, the polymer or oligomer used in the present invention may include branching in the main chain and thus may have three or more terminals.

The polymer or oligomer used in the present invention has at least one "polymerizable substituent". This "polymerizable substituent" refers to a substituent that can form an intermolecular bond between at least two molecules through a polymerization reaction, and it is described in detail below.

The polymerizable substituent can be exemplified by groups that contain a carbon-carbon multiple bond (e.g., the vinyl group, acetylene group, butenyl group, acrylic group, acrylate group, acrylamide group, methacryl group, methacrylate group, methacrylamide group, allene group, allyl group, vinyl ether group, vinylamino group, furyl group, pyrrole group, thiophene group, silole group, and so forth), groups that contain a small ring (e.g., cyclopropyl, cyclobutyl, epoxy, the oxetane group, the diketene group, the episulfide group, and so forth), lactone groups, lactam groups, and groups containing a siloxane derivative. In addition to the preceding groups, combinations of groups capable of forming an ester bond or amide bond can also be used. Examples here are the combination of an ester group with the amino group and the combination of an ester group with the hydroxyl group. The oxetane group, epoxy group, vinyl group, acrylate group, and methacrylate group are preferred for the polymerizable substituent from the standpoint of reactivity.

The polymerizable substituent may be introduced in pendant position on the polymer or oligomer, or in terminal position, or at both pendant and terminal position.

The case of the introduction of the polymerizable substituent in terminal position on the polymer or oligomer is considered in detail in the following. The following general formulas (7a), (8a), (9a), (10a), (11a), and (12a) are examples of polymers or oligomers according to the present invention in which the polymerizable substituent is introduced at the terminals of the polymer or oligomer and the hole-transporting repeat unit has general formula (1a), (2a), (3a), (4a), (5a), or (6a), supra.

[Formula 18]

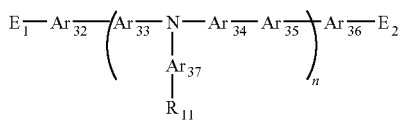
(7a)

[Formula 19]

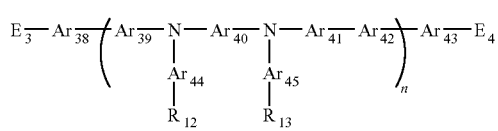
(8a)

[Formula 20]

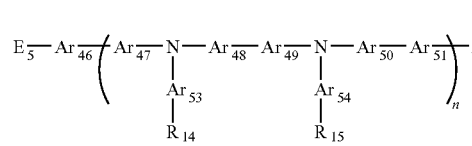
(9a)

[Formula 21]

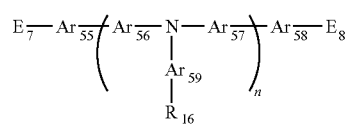
(10a)

[Formula 22]

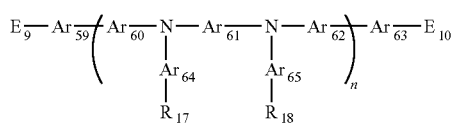
(11a)

[Formula 23]

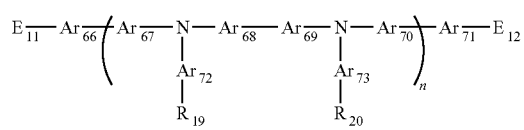
(12a)

(in general formulas (7a), (8a), (9a), (10a), (11a), and (12a), $Ar_{32}$ to $Ar_{73}$ each independently represent substituted or unsubstituted arylene or heteroarylene; $E_1$ to each represent a group that has a polymerizable substituent; $R_{11}$ to $R_{20}$ each independently represent —$R^1$, —$OR^2$, —$SR^3$, —$OCOR^4$, —$COOR^5$, —$SiR^6R^7R^8$, or a general formula as follows

[Formula 24]

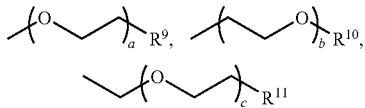

($R^1$ to $R^{11}$ represent the hydrogen atom, $C_{1-22}$ straight-chain, cyclic or branched alkyl, or $C_{2-30}$ aryl or heteroaryl, and a, b, and c each represent an integer with a value of at least 1 and are preferably integers from 1 to 4) and n is an integer with a value of at least 1).

$E_1$ to $E_{12}$ are, for example, a group as yielded by the bonding of at least one of the aforementioned polymerizable substituents to an alkyl group, alkoxy group, aryl group, arylene group, heteroaryl group, heteroarylene group, and so forth, and may be a group having an arylamine structure. $E_1$ to $E_{12}$ are preferably an oxetane-containing group, of which the following

[Formula 25]

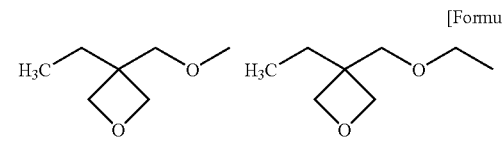

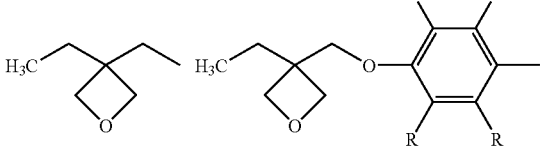

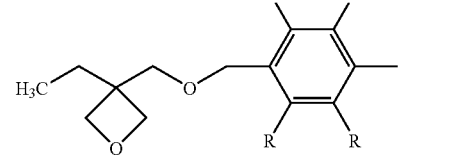

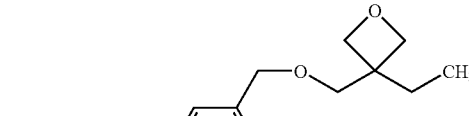

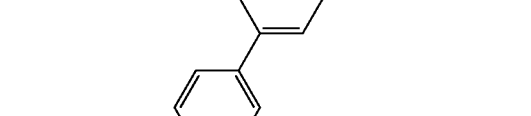

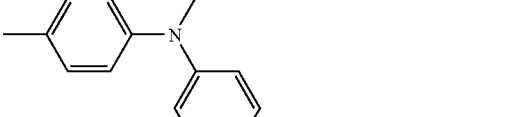

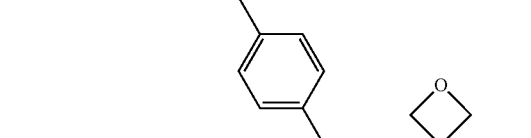

-continued

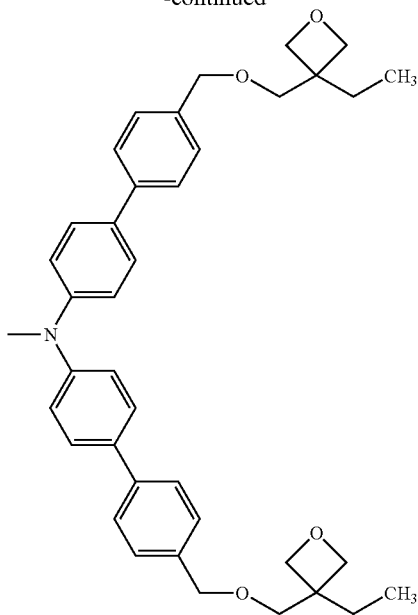

are examples.

The numerical average of the repeat number n in general formulas (7a), (8a), (9a), (10a), (11a), and (12a) is preferably at least 2 but not more than 100 and more preferably is at least 2 but not more than 20. The film production consistency is impaired when n is too low. When n is too large, there is little change in solubility even when the polymerization reaction is carried out and the capacity for multilayering is thus impaired.

The number-average molecular weight of the polymer or oligomer used in the present invention is preferably at least 1,000 but not more than 100,000 and more preferably is at least 1,000 but not more than 10,000. The film production consistency is impaired when the molecular weight is less than 1,000. When the molecular weight exceeds 100,000, there is little change in solubility even when the polymerization reaction is carried out and the capacity for multilayering is thus impaired. The number-average molecular weight of the polymer or oligomer is the number-average molecular weight when measurement is carried out by gel permeation chromatography using polystyrene standards.

The polydispersity of the polymer or oligomer used in the present invention is preferably larger than 1.0, more preferably is at least 1.1 but not more than 5.0, and most preferably is at least 1.2 but not more than 3.0. There is a tendency for aggregation to readily occur after film formation when the polydispersity is too small, while a trend of declining device characteristics sets in when the polydispersity is too large. The polydispersity of the polymer or oligomer is the value (weight-average molecular weight/number-average molecular weight) measured by gel permeation chromatography using polystyrene standards.

The polymer or oligomer used in the present invention can be produced by various synthesis procedures known to the individual skilled in the art. For example, considering the case in which the individual monomer units contain an aromatic ring and a polymer is produced in which the aromatic rings are bonded to each other, the methods described by Yamamoto et al. (T. Yamamoto et al., *Bull. Chem. Soc. Jap.*, Volume 51, Number 7, p. 2091 (1978)) and Zembayashi et al. (M. Zembayashi et al., *Tet. Lett.*, Volume 47, p. 4089 (1977)) can be used, while the method reported by Suzuki et al. (A. Suzuki et al., *Synthetic Communications*, Volume 11, Number 7, p. 513 (1981)) is a general method of polymer production. In this reaction, a Pd-catalyzed cross-coupling reaction (commonly known as a "Suzuki reaction") occurs between an aromatic boronic acid derivative and an aromatic halide, and the polymer or oligomer used in the present invention can be produced using this reaction to bond the corresponding aromatic rings to each other.

This reaction requires a soluble Pd compound in the form of a Pd(II) salt or a Pd(0) complex. Generally preferred Pd sources are $Pd(Ph_3P)_4$, $Pd(OAc)_2$ complexes with tertiary phosphine ligands, and the $PdCl_2(dppf)$ complex, at 0.01 to 5 mole % with reference to the aromatic reactants. This reaction also requires a base, and aqueous alkali carbonate or bicarbonate is most preferred. The reaction can also be promoted in nonpolar solvents using a phase-transfer catalyst. N,N-dimethylformamide, toluene, anisole, dimethoxyethane, tetrahydrofuran, and so forth are used as the solvent.

A polymerization initiator may additionally be incorporated in the organic electronic material of the present invention in addition to the aforementioned polymer or oligomer. This polymerization initiator should exhibit the capacity to induce polymerization of the polymerizable substituent upon the application of heat, light, microwaves, radiation, an electron beam, and so forth, but is not otherwise particularly limit; however, it preferably can initiate polymerization upon exposure to light and/or the application of heat and more preferably can initiate polymerization upon exposure to light (referred to below as a photoinitiator). The photoinitiator should exhibit the capacity to induce the polymerization of the polymerizable substituent upon exposure to light at from 200 nm to 800 nm, but is not otherwise particularly limited. When, for example, the polymerizable substituent is the oxetane group, iodonium salts, sulfonium salts, and ferrocene derivatives are preferred from a reactivity standpoint, and examples of these compounds are provided below.

[Formula 26]

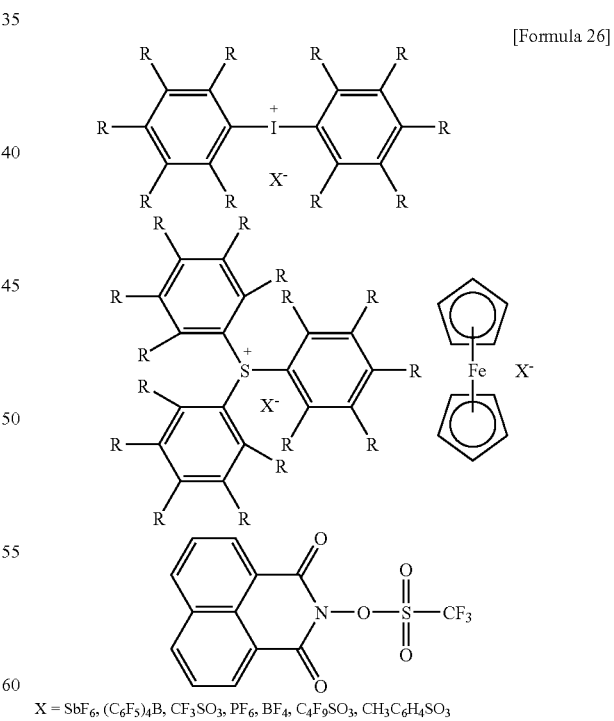

$X = SbF_6, (C_6F_5)_4B, CF_3SO_3, PF_6, BF_4, C_4F_9SO_3, CH_3C_6H_4SO_3$

The photoinitiator may be used in combination with a photosensitizer in order to increase the photosensitivity. The photosensitizer can be exemplified by anthracene derivatives and thioxanthone derivatives.

The incorporation rate for the polymerization initiator is preferably 0.1 weight % to 10 weight %, more preferably 0.2 weight % to 8 weight %, and particularly preferably 0.5 to 5 weight %, in each case with reference to the total weight of the organic electronic material. It becomes increasingly difficult to elaborate a multilayer configuration when the polymerization initiator is incorporated at less than 0.1 weight %, while a trend of declining device characteristics sets in at above 10 weight %.

In order to adjust the electrical characteristics, a carbon material may also be incorporated—in addition to the above-cited polymer or oligomer—into the organic electronic material of the present invention.

The various layers used in, e.g., an organic electronic device and so forth, can be formed using the organic electronic material of the present invention, for example, as follows: a solution containing the organic electronic material of the present invention is coated on a desired substrate by a known method (for example, an inkjet procedure; casting; immersion; a printing procedure such as relief printing, intaglio printing, offset printing, planographic printing, relief reverse printing, screen printing, and gravure printing; or spin coating), after which the polymerization reaction of the polymer or oligomer is induced by, for example, exposure to light or the application of heat, in order to cause a change in the solubility (cure) of the applied layer. Repetition of this process makes it possible to elaborate a polymer organic electronic device or organic EL device as a multilayer configuration.

The coating method cited above can be carried out in the temperature range generally from −20 to +300° C., preferably 10 to 100° C., and particularly preferably 15 to 50° C. The solvent used in the solution cited above is not particularly limited and can be exemplified by chloroform, methylene chloride, dichloroethane, tetrahydrofuran, toluene, xylene, mesitylene, anisole, acetone, methyl ethyl ketone, ethyl acetate, butyl acetate, ethyl cellosolve acetate, and so forth.

The light source used to carry out the light exposure cited above can be, for example, a low-pressure mercury lamp, medium-pressure mercury lamp, high-pressure mercury lamp, ultrahigh-pressure mercury lamp, metal halide lamp, xenon lamp, fluorescent lamp, light-emitting diode, sunlight, and so forth. The heat treatment can be carried out on a hot plate or in an oven and can be run in the temperature range from 0 to +300° C., preferably 20 to 250° C., and particularly preferably 80 to 200° C.

The organic electronic material of the present invention can be used by itself as the functional material of an organic electronic device. In addition, the organic electronic material of the present invention can be used by itself as a hole injection layer, hole transport layer, electron blocking layer, light-emitting layer, hole blocking layer, electron transport layer, or electron injection layer in an organic EL device. It may also be used for organic electronic devices and organic EL devices with various additives incorporated therein. For example, a metal complex containing a central metal such as Ir and Pt can be used in the case of application for the light-emitting layer of an organic EL device. An electron acceptor (e.g., a triphenylamine derivative, tetracyanoquinodimethane) and a variety of oxidizing agents can be used in the case of application for a hole injection layer or hole transport layer.

The organic electronic device and the organic EL device of the present invention are provided with a layer that contains the organic electronic material of the present invention, but are not otherwise particularly limited with regard to their structure and so forth. General structures for organic ELs are disclosed in, for example, U.S. Pat. No. 4,539,507 and U.S. Pat. No. 5,151,629. Polymer-containing organic EL devices are disclosed in, for example, WO 90/13148 and EP 0 443 861. As a general matter, these contain an electroluminescent layer (light-emitting layer) between a cathode (negative electrode) and an anode (positive electrode) wherein at least one of the electrodes is transparent. In addition, at least one electron injection layer and/or electron transport layer may be inserted between the electroluminescent layer (light-emitting layer) and the cathode and at least one hole injection layer and/or hole transport layer may be inserted between the electroluminescent layer (light-emitting layer) and the anode.

The material of the above-cited cathode, for example, preferably is a metal or metal alloy such as Li, Ca, Mg, Al, In, Cs, Ba, Mg/Ag, LiF, CsF, and so forth. The anode can be a metal (e.g., Au) or other material that exhibits a metallic conductivity, for example, an oxide (e.g., ITO: indium oxide/tin oxide), on a transparent substrate (e.g., glass or a transparent polymer).

In accordance with the preceding description, the organic electronic material of the present invention can be used as a hole injection layer, hole transport layer, light-emitting layer, electron transport layer, electron injection layer, and so forth in organic electronic devices, and in particular is used preferably as a hole injection layer, hole transport layer, and/or light-emitting layer in an organic EL device, more preferably as a hole injection layer and/or hole transport layer in an organic EL device, and most preferably as a hole transport layer in an organic EL device. The film thickness of these layers is not particularly limited, but 10 to 100 nm is preferred, 20 to 60 nm is more preferred, and 20 to 40 nm is even more preferred.

EXAMPLES

The present invention is described by the following examples, but is not limited thereby.

Examples of Synthesis of the Polymerizable Substituent-Containing Monomer

Monomer Synthesis Example 1

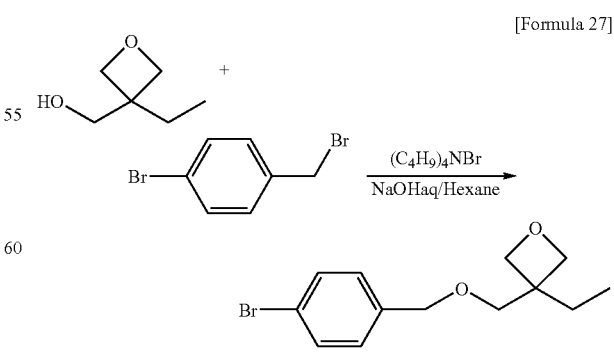

[Formula 27]

Figure 2:
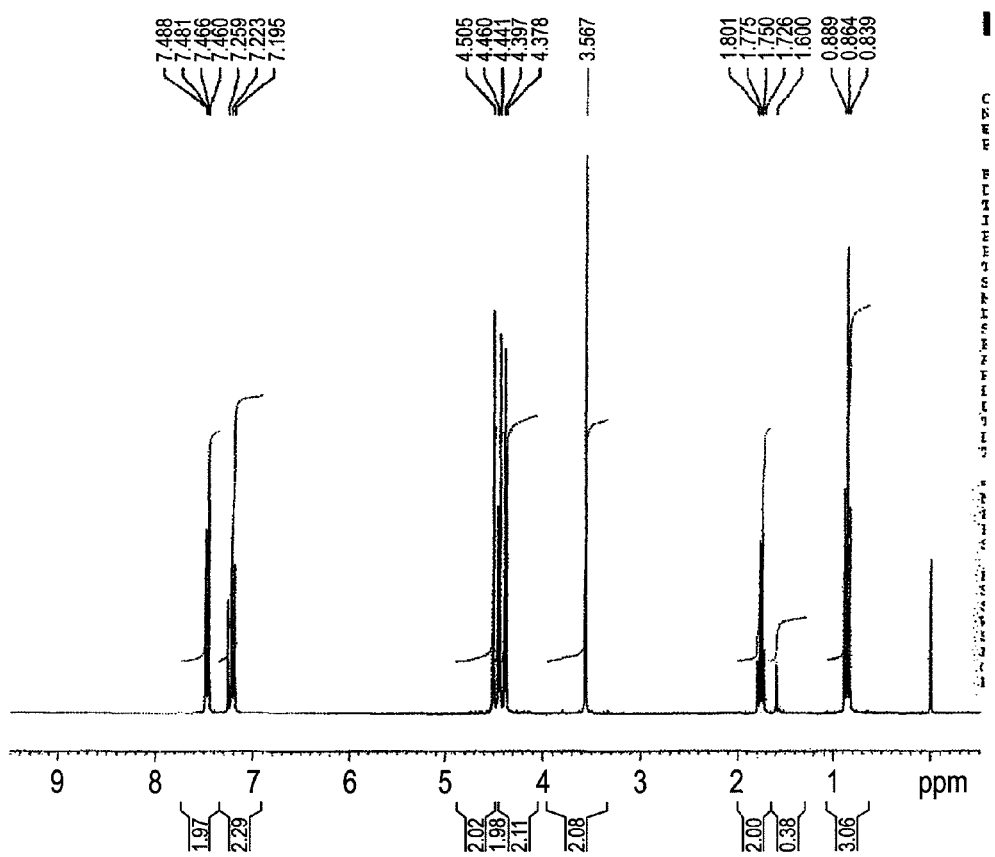
FIG. 2 is the $^1$H-NMR spectrum of the monomer A synthesized in Monomer Synthesis Example 1.

3-ethyl-3-hydroxymethyloxetane (50 mmol), 4-bromobenzyl bromide (50 mmol), n-hexane (200 mL), tetrabutylammonium bromide (2.5 mmol), and 50 weight % aqueous sodium hydroxide solution (36 g) were introduced into a roundbottom flask and were stirred for 6 hours under nitrogen while heating to 70° C. After cooling to room temperature (25° C.), 200 mL water was added and extraction with n-hexane was carried out. After the solvent had been distilled off, purification by silica gel column chromatography and vacuum distillation yielded 9.51 g polymerizable substituent-containing monomer A as a colorless oil. Yield=67 weight %. $^1$H-NMR (300 MHz, CDCl$_3$, δ ppm): 0.86 (t, J=7.5 Hz, 3H), 1.76 (t, J=7.5 Hz, 2H), 3.57 (s, 2H), 4.39 (d, J=5.7 Hz, 2H), 4.45 (d, J=5.7 Hz, 2H), 4.51 (s, 2H), 7.22 (d, J=8.4 Hz, 2H), 7.47 (d, J=8.4 Hz, 2H). The $^1$H-NMR spectrum of polymerizable substituent-containing monomer A is shown in FIG. 2.

Monomer Synthesis Example 2

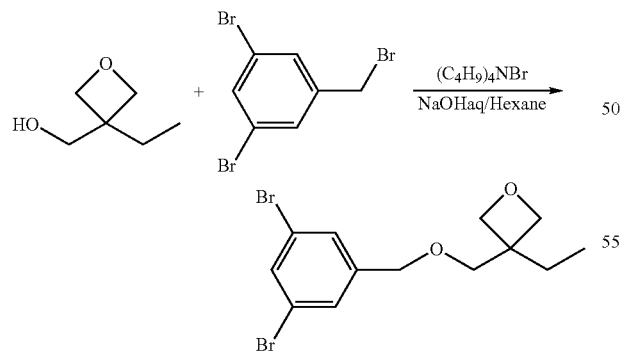

[Formula 28]

Figure 3:
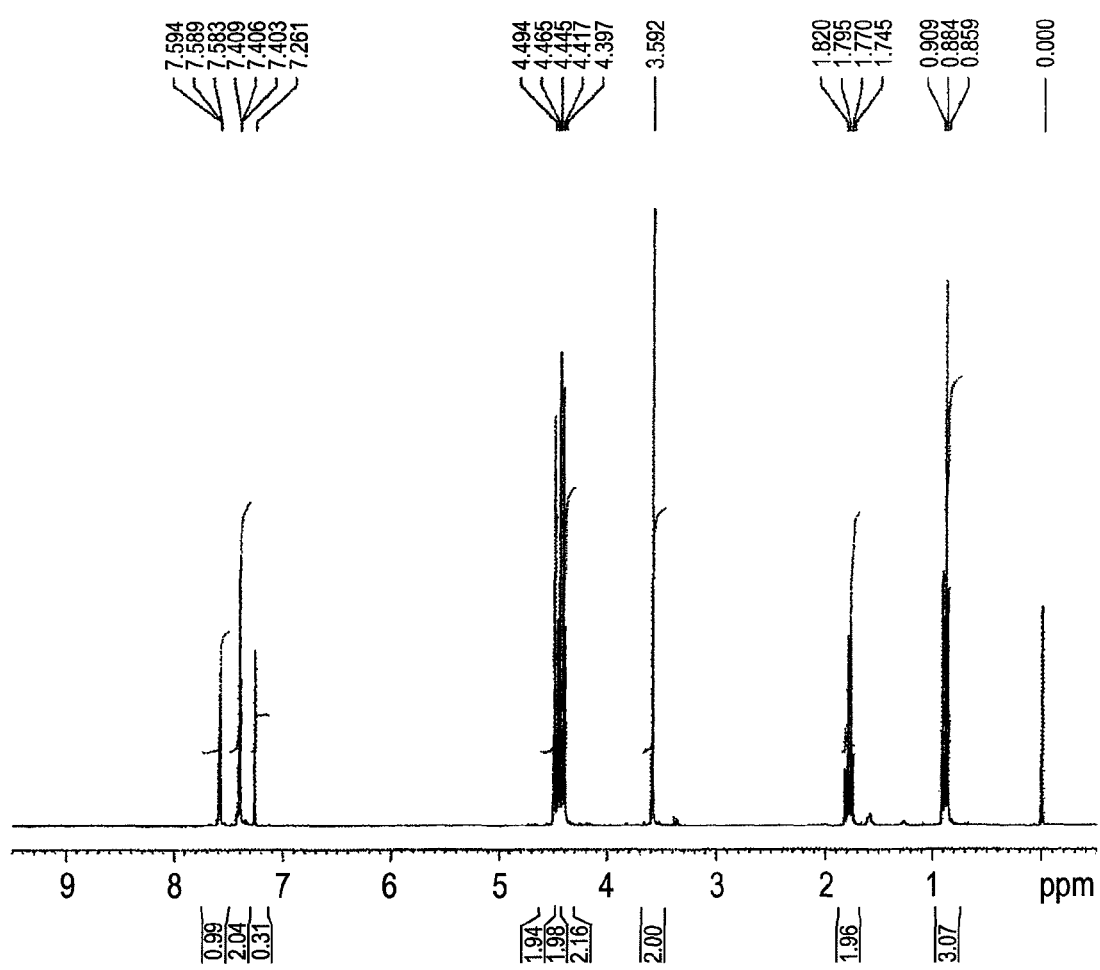
FIG. 3 is the $^1$H-NMR spectrum of the monomer B synthesized in Monomer Synthesis Example 2.

3-ethyl-3-hydroxymethyloxetane (5 mmol), 3,5-bromobenzyl bromide (5 mmol), n-hexane (20 mL), tetrabutylammonium bromide (0.25 mmol), and 50 weight % aqueous sodium hydroxide solution (3.6 g) were introduced into a roundbottom flask and were stirred for 6 hours under nitrogen while heating to 70° C. After cooling to room temperature (25° C.), 20 mL water was added and extraction with toluene was carried out. After the solvent had been distilled off, purification by silica gel column chromatography yielded 1.75 g polymerizable substituent-containing monomer B as a colorless solid. Yield=96 weight %. $^1$H-NMR (300 MHz, CDCl$_3$, δ ppm): 0.88 (t, J=7.5 Hz, 3H), 1.78 (t, J=7.5 Hz, 2H), 3.59 (s, 2H), 4.40 (d, J=5.7 Hz, 2H), 4.48 (d, J=5.7 Hz, 2H), 4.49 (s, 2H), 7.41 (m, 2H), 7.59 (m, 1H). The $^1$H-NMR spectrum of polymerizable substituent-containing monomer B is shown in FIG. 3.

Oligomer Syntheses

Oligomer Synthesis Example 1

[Formula 29]

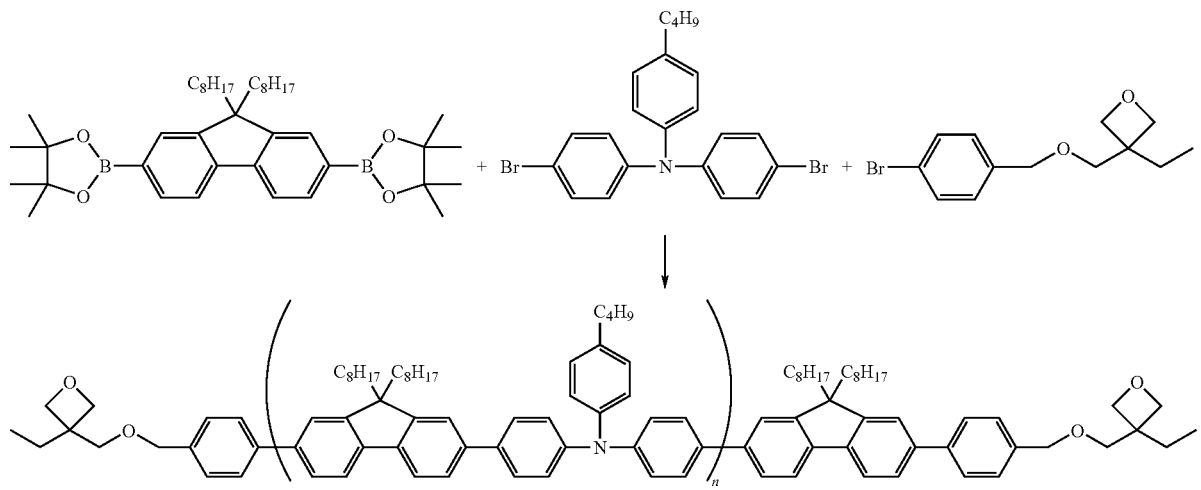

2,7-bis(4,4,5,5-tetramethyl-1,3,2-dioxaborolan-2-yl)-9,9-dioctylfluorene (0.4 mmol), 4,4'-dibromo-4"-n-butyltriphenylamine (0.32 mmol), polymerizable substituent-containing monomer A (0.16 mmol), tetrakistriphenylphosphine palladium (0.008 mmol), 2 M aqueous potassium carbonate solution (5.3 mL), Aliquat 336 (0.4 mmol), and anisole (4 mL) were introduced into a sealable fluororesin container and were stirred for 2 hours under nitrogen in the sealed container under microwave irradiation at 90° C. The reaction solution was poured into a methanol/water mixed solvent (9:1) and the precipitated polymer was filtered off. Purification by two reprecipitations yielded an oligomer A that had a polymerizable substituent and a hole-transporting repeat unit. The obtained oligomer A had a number-average molecular weight of 4652 as polystyrene and a polydispersity of 1.83.

Oligomer Synthesis Example 2

Figure 4:
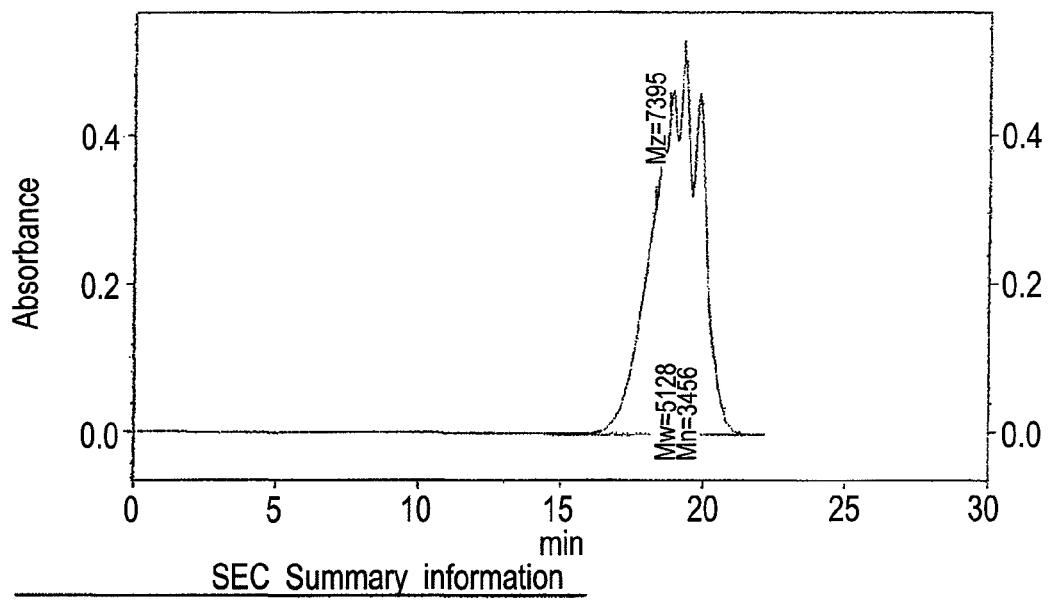
FIG. 4 is the gel permeation chromatogram of the oligomer B synthesized in Oligomer Synthesis Example 2.

Synthesis was carried out by the same procedure as in Oligomer Synthesis Example 1 using 2,7-bis(4,4,5,5-tetramethyl-1,3,2-dioxaborolan-2-yl)-9,9-dioctylfluorene (0.4 mmol), 4,4'-dibromo-4"-n-butyltriphenylamine (0.24 mmol), polymerizable substituent-containing monomer A (0.32 mmol), tetrakistriphenylphosphine palladium (0.008 mmol), 2 M aqueous potassium carbonate solution (5.3 mL), Aliquat 336 (0.4 mmol), and anisole (4 mL) to obtain an oligomer B that had a polymerizable substituent and a hole-transporting repeat unit. The obtained oligomer B had a number-average molecular weight of 3456 as polystyrene and a polydispersity of 1.48. The gel permeation chromatogram of oligomer B is shown in FIG. 4.

Oligomer Synthesis Example 3

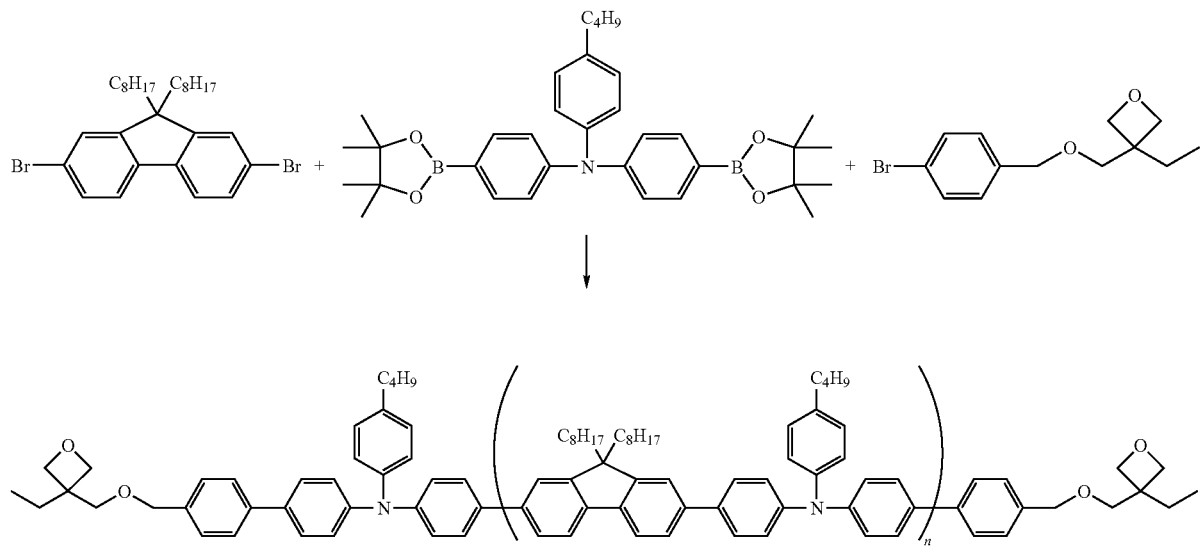

[Formula 30]

Synthesis was carried out by the same procedure as in Oligomer Synthesis Example 1 using 4,4'-bis(4,4,5,5-tetramethyl-1,3,2-dioxaborolan-2-yl)-4''-n-butyltriphenylamine mmol), 2,7-dibromo-9,9-dioctylfluorene (0.32 mmol), polymerizable substituent-containing monomer A (0.16 mmol), tetrakistriphenylphosphine palladium (0.008 mmol), 2 M aqueous potassium carbonate solution (5.3 mL), Aliquat 336 (0.4 mmol), and anisole (4 mL) to obtain an oligomer C that had a polymerizable substituent and a hole-transporting repeat unit. The obtained oligomer C had a number-average molecular weight of 3065 as polystyrene and a polydispersity of 1.46.

Oligomer Synthesis Example 4

Synthesis was carried out by the same procedure as in Oligomer Synthesis Example 1 using 4,4'-bis(4,4,5,5-tetramethyl-1,3,2-dioxaborolan-2-yl)-4''-n-butyltriphenylamine (0.4 mmol), 4,9-dibromo-10b-octyl-1,2,3,10b-tetrahydrofluoranthene (0.32 mmol), polymerizable substituent-containing monomer A (0.16 mmol), tetrakistriphenylphosphine palladium (0.008 mmol), 2 M aqueous potassium carbonate solution (5.3 mL), Aliquat 336 (0.4 mmol), and anisole (4 mL) to obtain an oligomer D that had a polymerizable substituent and a hole-transporting repeat unit. The obtained oligomer D had a number-average molecular weight of 2886 as polystyrene and a polydispersity of 1.83.

[Formula 31]

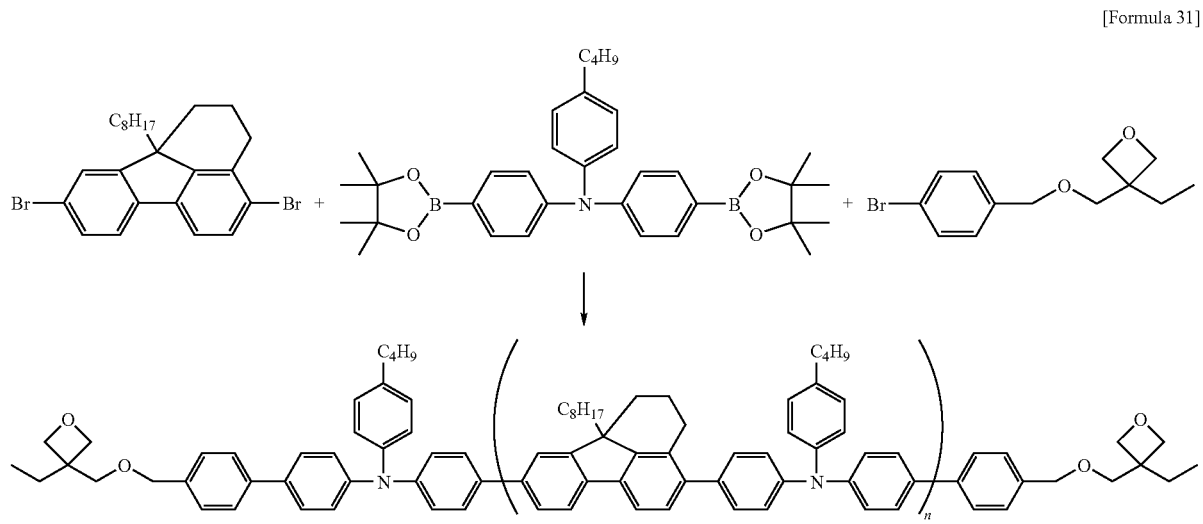

Oligomer Synthesis Example 5

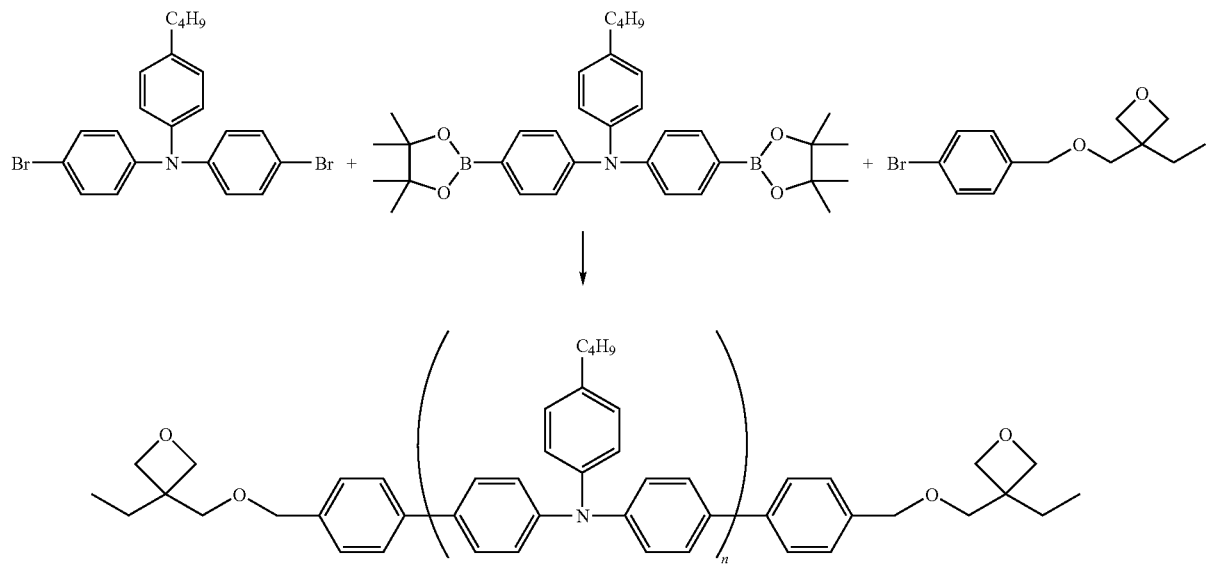

[Formula 32]

Synthesis was carried out by the same procedure as in Oligomer Synthesis Example 1 using 4,4'-bis(4,4,5,5-tetramethyl-1,3,2-dioxaborolan-2-yl)-4"-n-butyltriphenylamine (0.4 mmol), 4,4'-dibromo-4"-n-butyltriphenylamine (0.32 mmol), polymerizable substituent-containing monomer A (0.16 mmol), tetrakistriphenylphosphine palladium (0.008 mmol), 2 M aqueous potassium carbonate solution (5.3 mL), Aliquat 336 (0.4 mmol), and anisole (4 mL) to obtain an oligomer E that had a polymerizable substituent and a hole-transporting repeat unit. The obtained oligomer E had a number-average molecular weight of 2856 as polystyrene and a polydispersity of 1.54.

Oligomer Synthesis Example 6

Synthesis was carried out by the same procedure as in Oligomer Synthesis Example 1 using 4,4'-bis(4,4,5,5-tetramethyl-1,3,2-dioxaborolan-2-yl)-4"-n-butyltriphenylamine (0.4 mmol), 6,13-dibromopentacyclo[12.3.1.1,10,1411,5,9]nonadeca-5,7,9(19),10,12,14(19)-hexaene (0.32 mmol), polymerizable substituent-containing monomer A (0.16 mmol), tetrakistriphenylphosphine palladium (0.008 mmol), 2 M aqueous potassium carbonate solution (5.3 mL), Aliquat 336 (0.4 mmol), and anisole (4 mL) to obtain an oligomer F that had a polymerizable substituent and a hole-transporting repeat unit. The obtained oligomer F had a number-average molecular weight of 4830 as polystyrene.

[Formula 33]

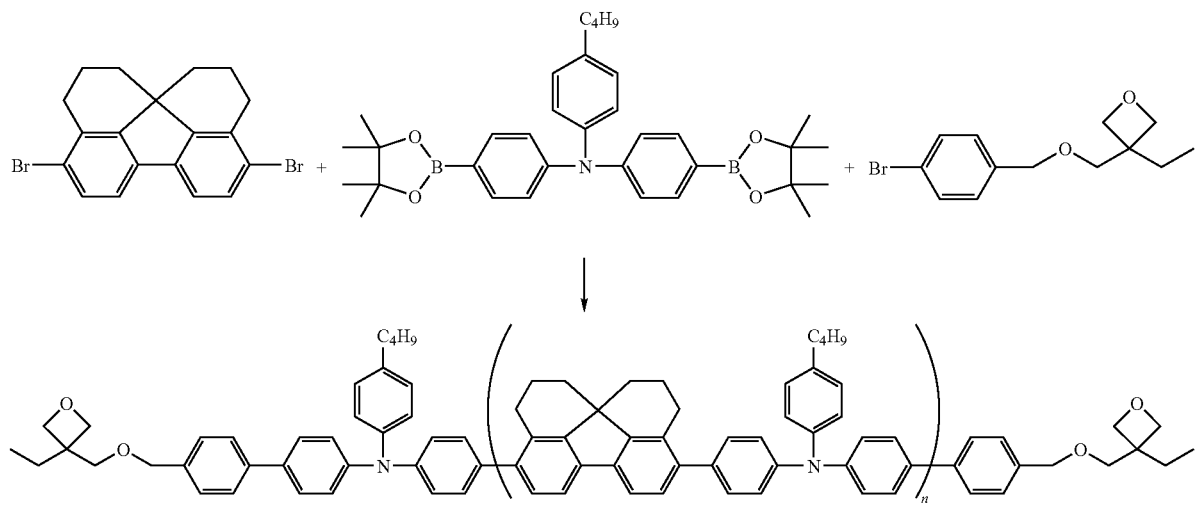

Oligomer Synthesis Example 7

[Formula 34]

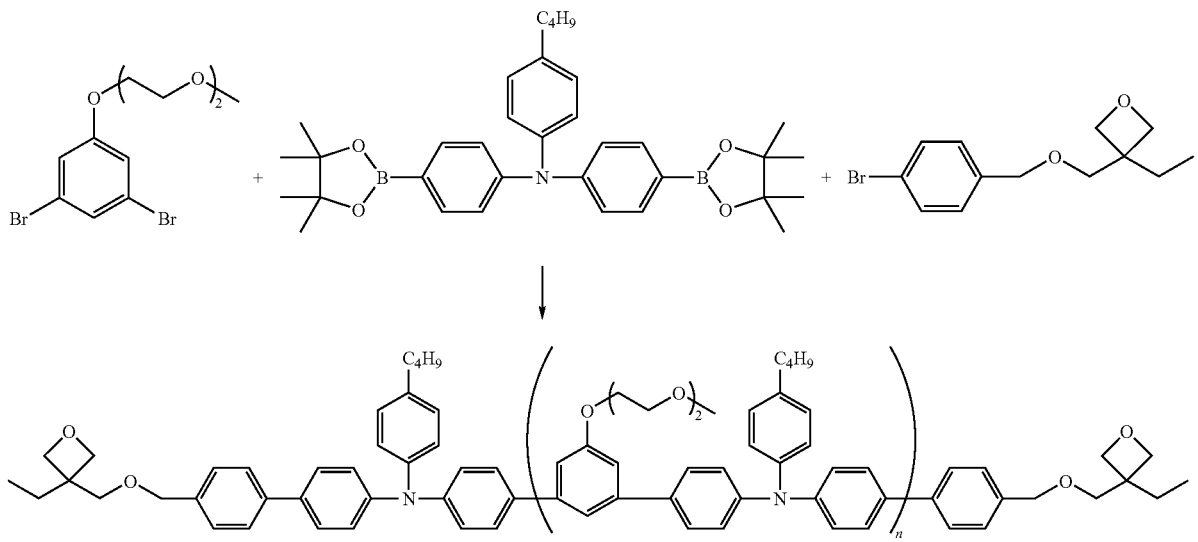

Synthesis was carried out by the same procedure as in Oligomer Synthesis Example 1 using 4,4'-bis(4,4,5,5-tetramethyl-1,3,2-dioxaborolan-2-yl)-4''-n-butyltriphenylamine (0.4 mmol), 1,3-dibromo-5-[2-(2-methoxyethoxy)ethoxy]benzene (0.32 mmol), polymerizable substituent-containing monomer A (0.16 mmol), tetrakistriphenylphosphine palladium (0.008 mmol), 2 M aqueous potassium carbonate solution (5.3 mL), Aliquat 336 (0.4 mmol), and anisole (4 mL) to obtain an oligomer G that had a polymerizable substituent and a hole-transporting repeat unit. The obtained oligomer G had a number-average molecular weight of 4010 as polystyrene.

Oligomer Synthesis Example 8

[Formula 35]

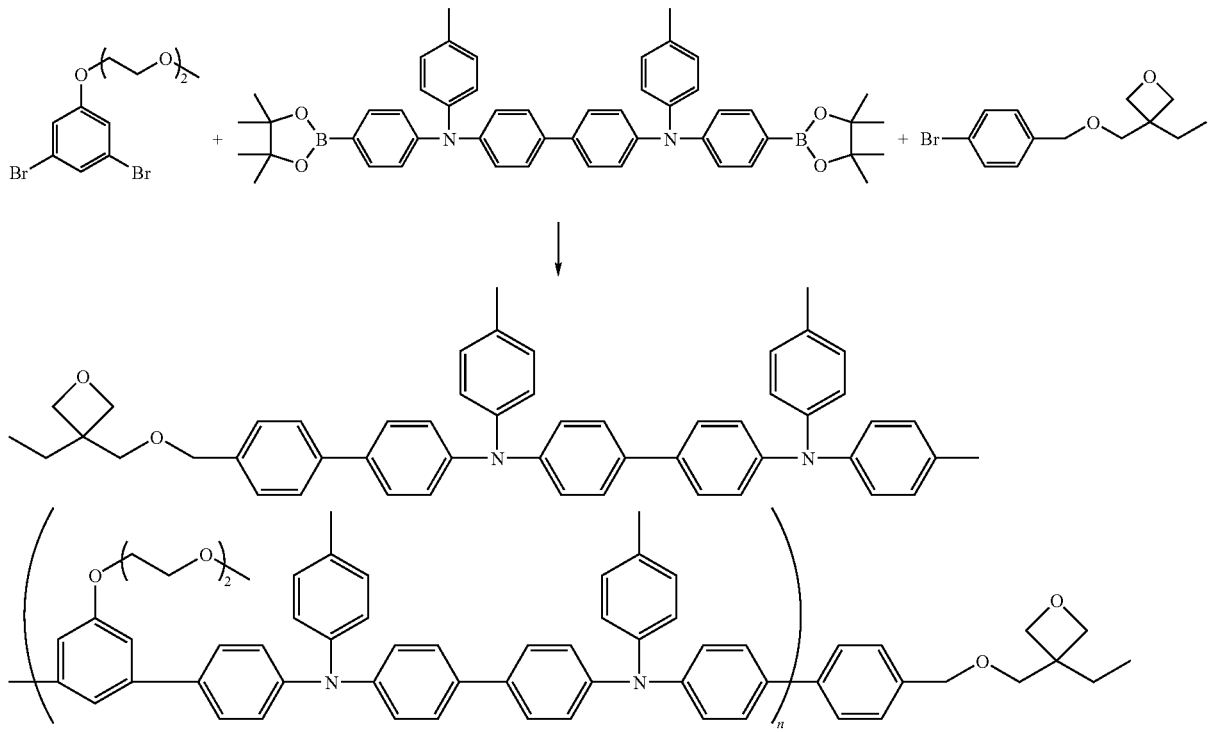

Synthesis was carried out by the same procedure as in Oligomer Synthesis Example 1 using $N^4,N^4$-bis[4-(4,4,5,5-tetramethyl[1,3,2]dioxaborolan-2-yl)phenyl]-$N^{4'},N^{4'}$-di-p-tolylbiphenyl-4,4'-diamine (0.4 mmol), 1,3-dibromo-5-[2-(2-methoxyethoxy)ethoxy]benzene (0.32 mmol), polymerizable substituent-containing monomer A (0.16 mmol), tetrakistriphenylphosphine palladium (0.008 mmol), 2 M aqueous potassium carbonate solution (5.3 mL), Aliquat 336 (0.4 mmol), and anisole (4 mL) to obtain an oligomer H that had a polymerizable substituent and a hole-transporting repeat unit. The obtained oligomer H had a number-average molecular weight of 4120 as polystyrene.

Comparative Polymer Synthesis Example

[Formula 36]

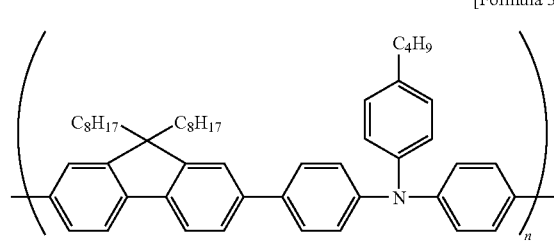

Synthesis was carried out by the same procedure as in Oligomer Synthesis Example 1 using 2,7-bis(4,4,5,5-tetramethyl-1,3,2-dioxaborolan-2-yl)-9,9-dioctylfluorene (0.4 mmol), 4,4'-dibromo-4"-n-butyltriphenylamine (0.4 mmol), tetrakistriphenylphosphine palladium (0.004 mmol), 2 M aqueous potassium carbonate solution (5.3 mL), Aliquat 336 (0.4 mmol), and anisole (4 mL) to obtain Comparative Polymer A that had a hole-transporting repeat unit and that lacked a polymerizable substituent. The obtained Comparative Polymer A had a number-average molecular weight of 60,216 as polystyrene.

Light-Emitting Polymer Synthesis Example

[Formula 37]

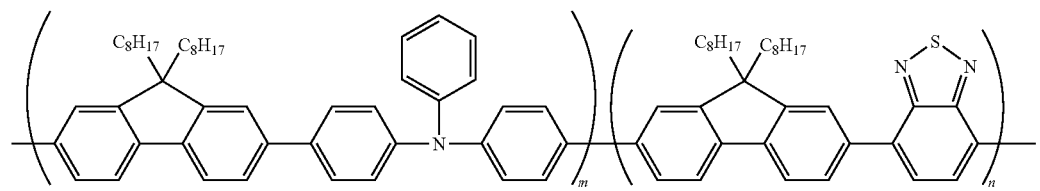

Synthesis was carried out by the same procedure as in Oligomer Synthesis Example 1 using 2,7-bis(4,4,5,5-tetramethyl-1,3,2-dioxaborolan-2-yl)-9,9-dioctylfluorene (0.4 mmol), 4,4'-dibromotriphenylamine (0.08 mmol), 4,7-dibromo-2,1,3-benzothiadiazole (0.32 mmol), tetrakistriphenylphosphine palladium (0.004 mmol), 2 M aqueous potassium carbonate solution (5.3 mL), Aliquat 336 (0.4 mmol), and anisole (4 mL) to obtain a yellow-emitting polymer.

Fabrication of Organic EL Devices

Example 1

A PEDOT:PSS dispersion (CH8000 LVW233 from Starck·Vtech) was spin-coated at 4000 rpm onto a glass substrate patterned with ITO at a width of 1.6 mm followed by drying by heating for 10 minutes at 200° C. in air on a hot plate to form a hole injection layer (40 nm). The following experiment was then carried out under a dry nitrogen atmosphere.

A coating solution obtained by mixing the oligomer A (4.4 mg) obtained in Oligomer Synthesis Example 1, a photoinitiator (0.13 mg) with the following chemical formula,

[Formula 38]

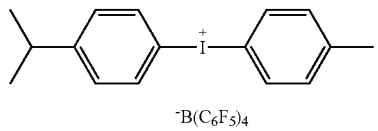

and toluene (1.2 mL) was then spin-coated at 3000 rpm on the hole injection layer, followed by curing by exposure to light (3 J/cm$^2$) using a metal halide lamp and heating for 60 minutes at 180° C. on a hot plate to form a hole transport layer (40 nm).

A toluene solution (1.5 weight %) of the yellow-emitting polymer obtained in the preceding light-emitting polymer synthesis example was then spin-coated at 3000 rpm on the hole transport layer followed by heating for 5 minutes at 80° C. on a hot plate to form a polymer light-emitting layer (film thickness=100 nm). Multilayering of the hole transport layer and the light-emitting layer could be carried out without dissolving in each other.

The resulting glass substrate was transferred into a vacuum vapor deposition instrument and an electrode was formed on the light-emitting layer in the sequence Ba (film thickness=3 nm) and Al (film thickness=100 nm).

After electrode formation, the substrate was transferred, without exposure to the atmosphere, into a dry nitrogen atmosphere and a sealing glass formed by the introduction of a 0.4 mm recess in 0.7 mm non-alkali glass was sealed to the ITO substrate by bonding with a photocurable epoxy resin, thus forming a polymer organic EL device having a multilayer structure. The following experiment was carried out in air at room temperature (25° C.).

When voltage was applied to the obtained organic EL device using the ITO as the anode and the Al as the cathode, yellow emission was observed at about 5 V and the current efficiency at a luminance of 6000 cd/m$^2$ was 5.4 cd/A. The current-voltage characteristic was measured using a 4140B picoammeter from Hewlett-Packard and the emitted luminance was measured using a Prichard 1980B luminance meter from Photo Research Corporation.

With regard to the lifetime, a lifetime of 30 hours was obtained when the luminance was measured with a BM-7 from Topcon Corporation while applying a constant current of 0.5 mA and the time required for the luminance to decline by half from the initial luminance (1000 cd/m$^2$) was measured.

Comparative Example 1

Figure 5:
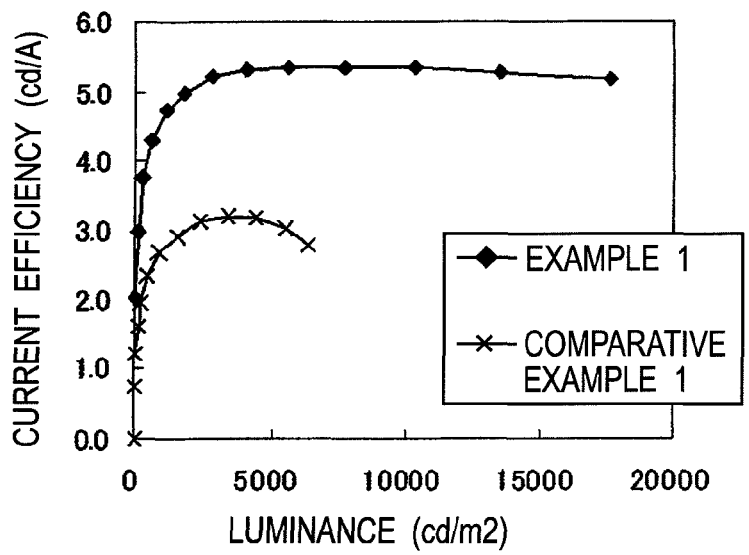
FIG. 5 is a graph that shows the luminance-current efficiency behavior of the organic EL devices of Example 1 and Comparative Example 1.
Figure 6:
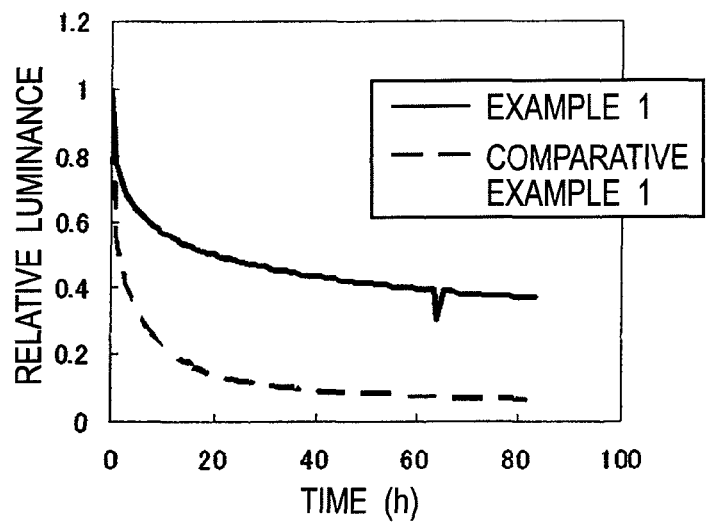
FIG. 6 is a graph that shows the lifetime curve of the organic EL devices of Example 1 and Comparative Example 1.

An organic EL device was fabricated as in Example 1, but in this case without forming the hole transport layer. When voltage was applied to this organic EL device, yellow emission was seen at about 5 V and the current efficiency at a luminance of 6000 cd/m² was 2.8 cd/A; Example 1 thus yielded an efficiency that was 1.9-times higher. Measurement of the lifetime showed that the luminance was halved in 1.5 hours, and Example 1 thus gave a lifetime what was 20 times as long. The luminance-current efficiency behavior of the organic EL devices of Example 1 and Comparative Example 1 is shown in FIG. 5, while the lifetime of the organic EL devices of Example 1 and Comparative Example 1 is shown in FIG. 6.

Example 2

Operating in a dry nitrogen atmosphere, a coating solution obtained by mixing the oligomer A (4.4 mg) obtained in Oligomer Synthesis Example 1, the photoinitiator (0.13 mg) used in Example 1, and toluene (500 µL) was spin-coated at 3000 rpm onto a glass substrate patterned with ITO at a width of 1.6 mm. This was followed by curing by exposure to light (3 J/cm²) using a metal halide lamp and heating for 15 minutes at 120° C. and 60 minutes at 180° C. on a hot plate to form a hole injection layer (50 nm).

A toluene solution (1.0 weight %) of a mixture of polymer 1 (75 weight parts) with the structural formula given below, polymer 2 (20 weight parts) with the structural formula given below, and polymer 3 (5 weight parts) with the structural formula given below was then spin-coated at 3000 rpm on the hole injection layer followed by heating for 5 minutes at 80° C. on a hot plate to form a polymer light-emitting layer (film thickness=80 nm). Multilayering of the hole injection layer and the light-emitting layer could be carried out without dissolving in each other. Ba/Al electrode formation and sealing were carried out as in Example 1 to fabricate a polymer organic EL device.

[Formula 39]

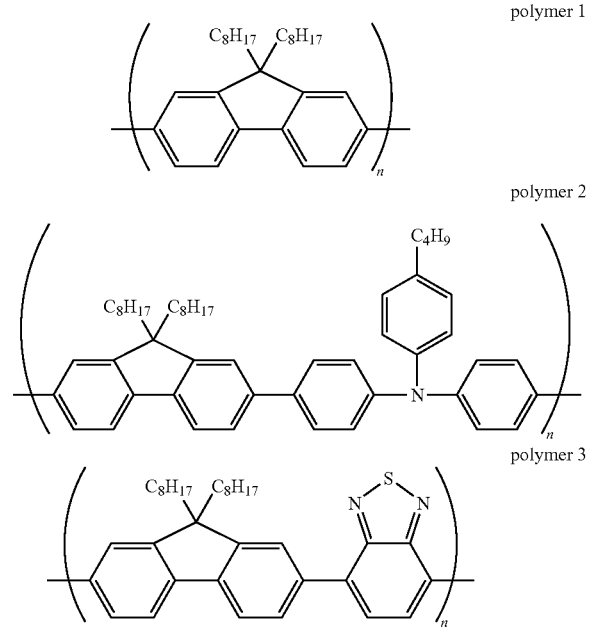

When voltage was applied to the obtained organic EL device using the ITO as the anode and the Al as the cathode, green emission was observed at about 4 V and the current efficiency at a luminance of 5000 cd/m² was 12.1 cd/A. With regard to the lifetime, a lifetime of 25 hours was obtained when the time required for the luminance to decline by half from the initial luminance (2000 cd/m²) was measured.

Example 3

An organic EL device was fabricated as in Example 2, but in this case using the oligomer E obtained in Oligomer Synthesis Example 5 as the hole injection layer material in place of oligomer A. In this case, multilayering of the hole injection layer and the light-emitting layer could again be carried out without dissolving in each other.

The current efficiency of this organic EL device was 10.4 cd/A at a luminance of 5000 cd/m². With regard to the lifetime, a lifetime of 25 hours was obtained when the time required for the luminance to decline by half from the initial luminance (2000 cd/m²) was measured.

Comparative Example 2

A PEDOT:PSS dispersion (CH8000 LVW233 from Starck Vtech) was spin-coated at 4000 rpm onto a glass substrate patterned with ITO at a width of 1.6 mm followed by drying by heating for 10 minutes at 200° C. in air on a hot plate to form a hole injection layer (40 nm). This was followed by formation of a light-emitting layer, Ba/Al electrode formation, and sealing as in Example 2 to fabricate an organic EL device.

The current efficiency of this organic EL device was 6.8 cd/A at a luminance of 5000 cd/m². With regard to the lifetime, a lifetime of 17 hours was obtained when the time required for the luminance to decline by half from the initial luminance (2000 cd/m²) was measured.

Figure 7:
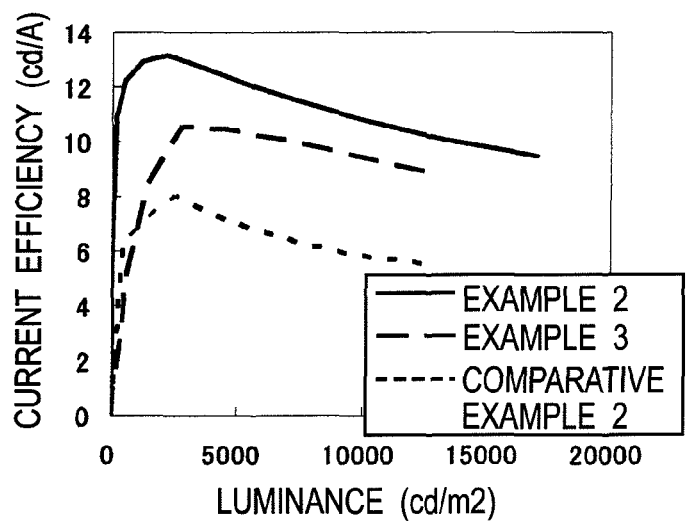
FIG. 7 is a graph that shows the luminance-current efficiency behavior of the organic EL devices of Example 2, Example 3, and Comparative Example 2.
Figure 8:
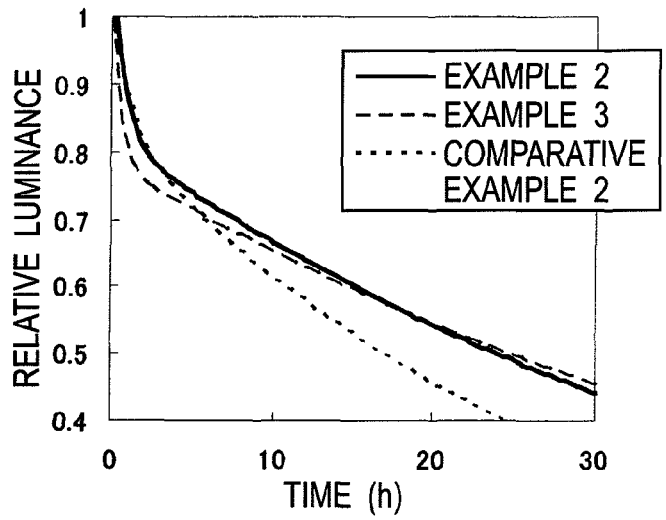
FIG. 8 is a graph that shows the lifetime curve of the organic EL devices of Example 2, Example 3, and Comparative Example 2.

Summarizing the results of Examples 2 and 3 and Comparative Example 2, the current efficiency of the organic EL device in Example 2 and Example 3 was 1.78 times and 1.53 times higher, respectively, than that in Comparative Example 2. The lifetime of the organic EL device in Example 2 and Example 3 was in both instances 1.47 times longer than that in Comparative Example 2. The luminance-current efficiency behavior of the organic EL devices of Examples 2 and 3 and Comparative Example 2 is shown in FIG. 7, while the lifetime of the organic EL devices of Examples 2 and 3 and Comparative Example 2 is shown in FIG. 8.

Examples of the Fabrication of Multilayer Thin-Film Structures

Example 4

The coating solution used to form the hole transport layer in Example 1 was spin-coated at 3000 rpm on a quartz substrate, followed by curing by exposure to light (3 J/cm²) using a metal halide lamp and heating for 60 minutes at 180° C. on a hot plate to produce a first layer. The film thickness of this first layer measured with a stylus-type profilometer (XP-2 from Ambios Technology, Inc.) was 40 nm.

The toluene solution of yellow-emitting polymer used in Example 1 was then spin-coated at 3000 rpm followed by heating for 5 minutes at 80° C. on a hot plate to form a polymer light-emitting layer (film thickness=100 nm). The overall film thickness measured by the stylus-type profilometer was 140 nm, which confirmed that the first layer had remained intact.

Comparative Example 3

A coating solution obtained by mixing the comparative polymer A (4.4 mg) obtained as described above, the photoinitiator (0.13 mg) used in Example 1, and toluene (1.2 mL) was spin-coated at 3000 rpm on a quartz substrate, followed by exposure to light (3 J/cm$^2$) using a metal halide lamp and heating for 60 minutes at 180° C. on a hot plate to produce a first layer. The film thickness of this first layer was 40 nm.

The toluene solution of yellow-emitting polymer used in Example 1 was then spin-coated at 3000 rpm followed by heating for 5 minutes at 80° C. on a hot plate to form a polymer light-emitting layer (film thickness=100 nm). The overall film thickness was 100 nm. Thus, the dissolution of the first layer occurred, therefore a multilayer structure could not be fabricated in Comparative Example 3.

The invention claimed is:

1. An organic electronic material, comprising (a) a polymer or oligomer having at least one polymerizable substituent and a hole-transporting repeat unit, and (b) a polymerization initiator, wherein the polymer or oligomer has the structure represented by general formula (10a) below:

[Formula 9]

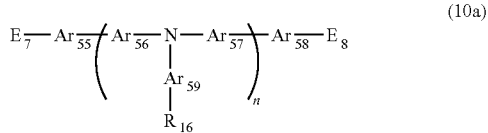

(10a)

(in the formula, $Ar_{55}$ to $Ar_{59}$ each independently represent substituted or unsubstituted arylene or heteroarylene; $E_7$ and $E_8$ each represent a group that has a polymerizable substituent, wherein said polymerizable substituent is introduced in a terminal position on the polymer or oligomer, and is an oxetane group; a numerical average of the repeat number n is at least 2 but not more than 100; and $R_{16}$ represents —$R^1$, —$OR^2$, —$SR^3$, —$OCOR^4$, —$COOR^5$, —$SiR^6R^7R^8$, or a general formula as follows:

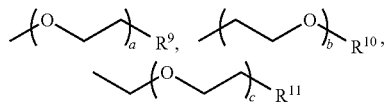

(where $R^1$ to $R^{11}$ represent the hydrogen atom, $C_{1-22}$ straight-chain, cyclic or branched alkyl, or $C_{2-30}$ aryl or heteroaryl, and a, b, and c each represent an integer with a value of at least 1)), and wherein the polymerization initiator is iodonium salt having $(C_6F_5)_4B^-$ as an anion.

2. The organic electronic material according to claim 1, wherein the number-average molecular weight of the polymer or oligomer is at least 1,000 and not more than 100,000.

3. The organic electronic material according to claim 1, wherein the polydispersity of the polymer or oligomer is larger than 1.0.

4. An organic electronic device fabricated by using the organic electronic material according to claim 1.

5. An organic electroluminescent device fabricated by using the organic electronic material according to claim 1.

6. An organic electroluminescent device in which at least an anode, a hole injection layer, a light-emitting layer, and a cathode are stacked, wherein the hole injection layer is a layer formed by using the organic electronic material according to claim 1.

7. An organic electroluminescent device in which at least an anode, a hole transport layer, a light-emitting layer, and a cathode are stacked, wherein the hole transport layer is a layer formed by the organic electronic material according to claim 1.

8. The organic electronic material according to claim 1, wherein the numerical average of n in general formula (10a) is 2 to 20.

9. The organic electronic material according to claim 1, wherein the polymerization initiator is included in the organic electronic material in an amount of 0.1 weight % to 10 weight %, based on a total weight of the organic electronic material.

10. The organic electronic material according to claim 1, wherein the polymerization initiator is a photoinitiator, and wherein the organic electronic material further includes a photosensitizer.

11. The organic electronic material according to claim 1, which further includes a carbon material in addition to said polymer or oligomer.

12. The organic electronic material according to claim 1, wherein $Ar_{55}$ to $Ar_{59}$ represent phenylene, $R_{16}$ represents butyl, and each of $E_7$ and $E_8$ represents

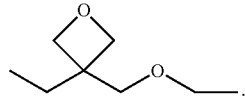

* * * * *